(12) United States Patent
Saito et al.

(10) Patent No.: US 11,476,414 B2
(45) Date of Patent: *Oct. 18, 2022

(54) EXCHANGE COUPLING FILM, MAGNETORESISTANCE EFFECT ELEMENT FILM USING THE EXCHANGE COUPLING FILM, AND MAGNETIC DETECTOR USING THE EXCHANGE COUPLING FILM

(71) Applicant: Alps Alpine Co., Ltd., Tokyo (JP)

(72) Inventors: Masamichi Saito, Miyagi-ken (JP); Hiroaki Endo, Miyagi-ken (JP); Fumihito Koike, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 241 days.

This patent is subject to a terminal disclaimer.

(21) Appl. No.: 16/748,473

(22) Filed: Jan. 21, 2020

(65) Prior Publication Data

US 2020/0161538 A1 May 21, 2020

Related U.S. Application Data

(63) Continuation of application No. PCT/JP2018/026314, filed on Jul. 12, 2018.

(30) Foreign Application Priority Data

Aug. 14, 2017 (JP) .............................. JP2017-156347
Dec. 26, 2017 (JP) .............................. JP2017-249083

(51) Int. Cl.
*G11B 5/39* (2006.01)
*G01R 33/09* (2006.01)
(Continued)

(52) U.S. Cl.
CPC .......... *H01L 43/10* (2013.01); *G01R 33/0052* (2013.01); *G01R 33/093* (2013.01); *G11B 5/3903* (2013.01); *G11B 5/3906* (2013.01)

(58) Field of Classification Search
None
See application file for complete search history.

(56) References Cited

U.S. PATENT DOCUMENTS 11,320,498 B2 * 5/2022 Saito ...................... H01L 43/08
11,333,720 B2 * 5/2022 Saito ...................... H01L 43/10
(Continued)

FOREIGN PATENT DOCUMENTS

| JP | 2000-215431 | 8/2000 |
| JP | 2001-134910 | 5/2001 |

(Continued)

OTHER PUBLICATIONS

International Search Report and Written Opinion from corresponding international application No. PCT/JP2018/026317, 8pgs., dated Sep. 11, 2018.

*Primary Examiner* — Jefferson A Evans
(74) *Attorney, Agent, or Firm* — Crowell & Moring LLP

(57) ABSTRACT

An exchange coupling film in which a magnetic field (Hex) at which the magnetization direction of a pinned magnetic layer is reversed is high, in which stability under high-temperature conditions is high, and which is excellent in strong-magnetic field resistance. The exchange coupling film includes an antiferromagnetic layer and a pinned magnetic layer including a ferromagnetic layer, the antiferromagnetic layer and the pinned magnetic layer being stacked together. The antiferromagnetic layer has a structure including a PtCr layer, a PtMn layer, and an IrMn layer stacked in this order. The IrMn layer is in contact with the pinned magnetic layer. The thickness of the PtMn layer is 12 Å or more, and the thickness of the IrMn layer is 6 Å. The sum of the thickness of the PtMn layer and the thickness of the IrMn layer is 20 Å or more.

16 Claims, 21 Drawing Sheets

(51) Int. Cl.
*H01L 43/10* (2006.01)
*G01R 33/00* (2006.01)

(56) References Cited

U.S. PATENT DOCUMENTS

| | | | | |
|---|---|---|---|---|
| 2002/0159202 A1* | 10/2002 | Yanagiuchi | ......... | G11B 5/3909 |
| | | | | 360/324.1 |
| 2002/0163767 A1* | 11/2002 | Terunuma | ............ | G11B 5/3903 |
| | | | | 360/324.12 |
| 2004/0008455 A1* | 1/2004 | Hasegawa | .............. | B82Y 25/00 |
| | | | | 360/324.12 |
| 2014/0293475 A1* | 10/2014 | Degawa | ............... | G11B 5/3912 |
| | | | | 360/75 |
| 2018/0275215 A1* | 9/2018 | Uchida | ................. | G01R 33/093 |
| 2020/0211746 A1* | 7/2020 | Saito | ....................... | H01L 43/08 |
| 2020/0284857 A1* | 9/2020 | Saito | ....................... | H01L 43/10 |
| 2020/0318996 A1* | 10/2020 | Saito | ........................ | G01D 5/16 |
| 2020/0319273 A1* | 10/2020 | Saito | ..................... | G01R 33/09 |
| 2020/0319274 A1* | 10/2020 | Saito | ....................... | H01L 43/10 |
| 2020/0328344 A1* | 10/2020 | Saito | .................... | G01R 33/098 |
| 2020/0348374 A1* | 11/2020 | Saito | .................... | G01R 33/093 |
| 2020/0348375 A1* | 11/2020 | Saito | ................. | G01R 33/0052 |

FOREIGN PATENT DOCUMENTS

| | | |
|---|---|---|
| JP | 2002-270921 | 9/2002 |
| JP | 2002-314169 | 10/2002 |
| JP | 2006-041511 | 2/2006 |
| JP | 2016-206075 | 12/2016 |
| JP | 7022764 B2 * | 2/2022 |
| WO | WO 2020137558 * | 7/2020 |

* cited by examiner

EXCHANGE COUPLING FILM, MAGNETORESISTANCE EFFECT ELEMENT FILM USING THE EXCHANGE COUPLING FILM, AND MAGNETIC DETECTOR USING THE EXCHANGE COUPLING FILM

CLAIM OF PRIORITY

This application is a Continuation of International Application No. PCT/JP2018/026314 filed on Jul. 12, 2018, which claims benefit of priority to Japanese Patent Application No. 2017-156347 filed on Aug. 14, 2017 and No. 2017-249083 filed on Dec. 26, 2017. The entire contents of each application noted above are hereby incorporated by reference.

BACKGROUND

1. Field of the Disclosure

The present disclosure relates to an exchange coupling film, to a magnetoresistance effect element using the exchange coupling film, and to a magnetic detector using the exchange coupling film.

2. Description of the Related Art

An exchange coupling film including an antiferromagnetic layer and a pinned magnetic layer is used for a magnetoresistance effect element and a magnetic detector. Japanese Unexamined Patent Application Publication No. 2000-215431 discloses that, in a magnetic recording medium, an exchange coupling film can be formed by combining a Co alloy serving as a ferromagnetic film with various alloys serving as antiferromagnetic films. Alloys such as CoMn, NiMn, PtMn, and PtCr are exemplified as the antiferromagnetic films.

When a magnetoresistance effect element is mounted on a substrate of a magnetic detector, it is necessary to subject solder to a reflow treatment (melting treatment). Moreover, the magnetic detector may be used in a high-temperature environment such as an environment in the vicinity of an engine in some cases. It is therefore preferable that, in an exchange coupling film used for the magnetic detector, a magnetic field (Hex) at which the magnetization direction of a pinned magnetic layer is reversed is high in order to allow a magnetic field to be detected over a wide dynamic range and that the stability of the exchange coupling film under high-temperature conditions is high.

Japanese Unexamined Patent Application Publication No. 2000-215431 relates to the exchange coupling film used for a magnetic recording medium and therefore does not describe the stability of a magnetic detector that uses the exchange coupling film under high-temperature conditions.

Recently a need exists for an exchange coupling film in which the magnetization direction of the pinned magnetic layer is not susceptible to strong magnetic fields even when the exchange coupling film is disposed near a strong magnetic field source such as a high-power motor, i.e., there is a need for an exchange coupling film having strong-magnetic field resistance.

SUMMARY

The present invention provides an exchange coupling film in which the magnetic field (Hex) at which the magnetization direction of a ferromagnetic layer, such as a pinned magnetic layer that is exchange-coupled with an antiferromagnetic layer, is reversed is large and therefore stability under high-temperature conditions is high and which has excellent strong-magnetic field resistance. The invention also provides a magnetoresistance effect element and a magnetic detector that use the exchange coupling film and are stable even in a high temperature environment and a strong-magnetic field environment.

An exchange coupling film includes an antiferromagnetic layer and a ferromagnetic layer that are stacked together, wherein the antiferromagnetic layer has a structure including a PtCr layer, a PtMn layer, and an IrMn layer that are stacked in this order such that the IrMn layer is disposed closest to the ferromagnetic layer. The IrMn layer may be stacked in contact with the ferromagnetic layer, or the structure of the antiferromagnetic layer may further include a PtMn layer stacked between the IrMn layer and the ferromagnetic layer.

In another aspect, an exchange coupling film comprises a antiferromagnetic layer that has a structure including the PtCr layer, the PtMn layer, and the IrMn layer. This allows M0/Ms to be negative, and its absolute value can be increased, so that the exchange coupling film has excellent strong-magnetic field resistance. The IrMn layer may be stacked in contact with the ferromagnetic layer, or the structure of the antiferromagnetic layer may further include a PtMn layer stacked between the IrMn layer and the ferromagnetic layer.

In another aspect, an exchange coupling film includes an antiferromagnetic layer and a ferromagnetic layer that are stacked together, wherein the antiferromagnetic layer includes an X(Cr—Mn) layer containing Mn, Cr, and one or two or more elements X selected from the group consisting of Ni and platinum-group elements, wherein the X(Cr—Mn) layer includes a first region closer to the ferromagnetic layer and a second region farther from the ferromagnetic layer, and wherein the content of Mn in the first region is higher than the content of Mn in the second region. In this exchange coupling film, Mn in the first region may enhance the exchange coupling, and Cr in the second region may increase the blocking temperature of the exchange coupling film. The platinum-group elements and Ni are each an element capable of forming an ordered phase together with Cr and Mn.

In another aspect, a magnetoresistance effect element includes the above exchange coupling film and a free magnetic layer that are stacked together, wherein the ferromagnetic layer of the exchange coupling film forms at least part of a pinned magnetic layer.

Another aspect of the present invention provides a magnetic detector including the above magnetoresistance effect element.

DESCRIPTION OF THE EXEMPLARY EMBODIMENTS

First Embodiment

Figure 1:
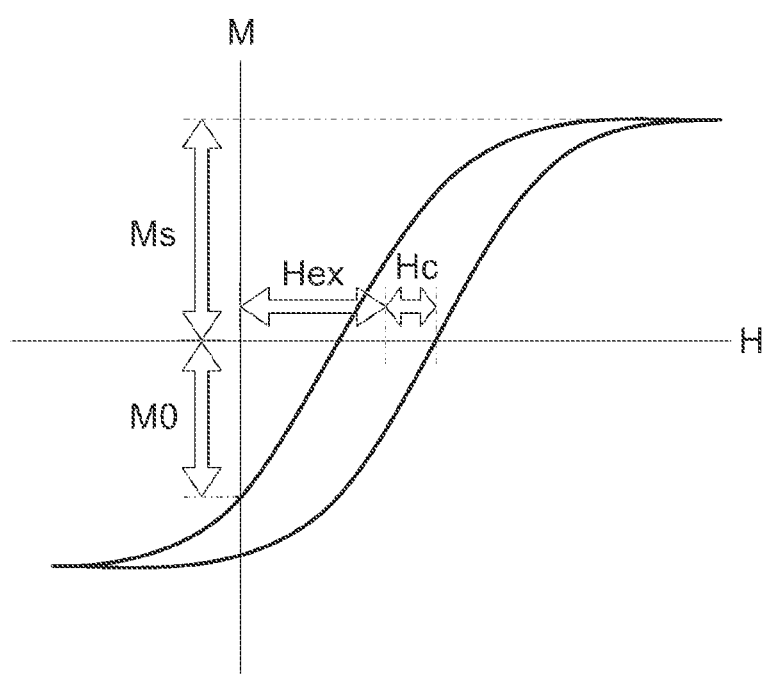
FIG. 1 is a graph showing a hysteresis loop in the magnetization curve of the exchange coupling film according to the present invention.

FIG. 1 is a graph showing a hysteresis loop in the magnetization curve of the exchange coupling film according to the present invention. Generally, a hysteresis loop formed in the M-H curve (magnetization curve) of a soft magnetic material is symmetric about the intersection of the H axis and the M axis (magnetic field H=0 A/m and magnetization M=0 A/m). However, as shown in FIG. 1, in the exchange coupling film according to the present invention, since an exchange coupling magnetic field Hex acts on a pinned magnetic layer including the ferromagnetic layer exchange-coupled with the antiferromagnetic layer, the hysteresis loop of the exchange coupling film has a shape shifted along the H axis according to the magnitude of the exchange coupling magnetic field Hex. The larger the exchange coupling magnetic field Hex, the less likely the reversal of the magnetization direction is to occur, and therefore the better the pinned magnetic layer of the exchange coupling film is.

The coercive force He is defined as the difference between the center of the hysteresis loop shifted along the H axis (the magnetic field intensity at the center corresponds to the exchange coupling magnetic field Hex) and the intercept of the hysteresis loop with the H axis. Suppose that the coercive force He is smaller than the Hex. In this case, even when an external magnetic field is applied and the pinned magnetic layer of the exchange coupling film is magnetized in a direction along the external magnetic field, the Hex stronger than the coercive force Hc allows the magnetization direction of the pinned magnetic layer to be aligned with the Hex when the application of the external magnetic field is terminated. Specifically, when the relation between the Hex and the coercive force Hc is Hex>Hc, the exchange coupling film has high strong-magnetic field resistance.

When the Hex is significantly larger than the coercive force Hc, the ratio (M0/Ms) of residual magnetization M0 to saturation magnetization Ms is negative as shown in FIG. 1. Specifically, when M0/Ms is negative, the exchange coupling film has higher strong-magnetic field resistance. The larger the absolute value of the negative M0/Ms, the higher the strong-magnetic field resistance of the exchange coupling film.

Figure 2:
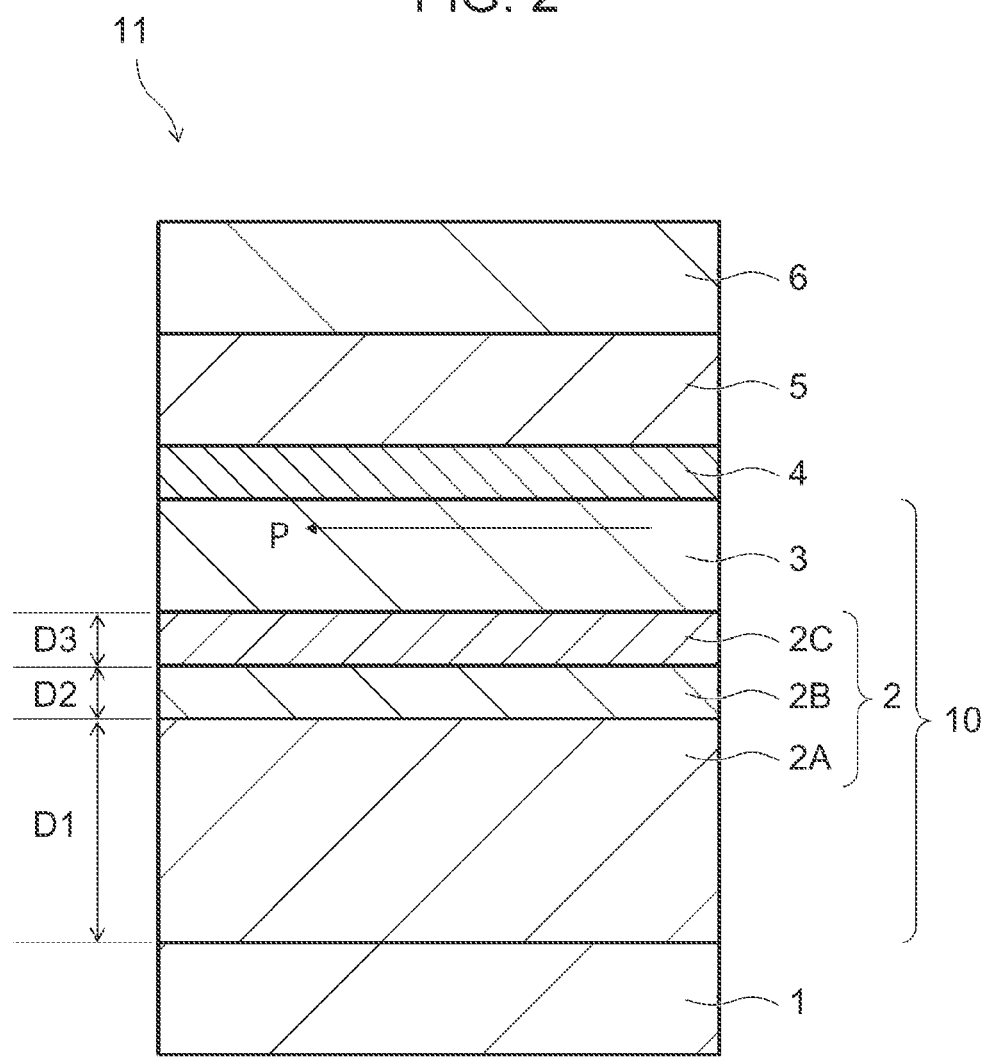
FIG. 2 is an illustration showing the layer structure of an exchange coupling film in a first embodiment of the present invention.

FIG. 2 shows the layer structure of a magnetic detector element 11 that uses an exchange coupling film 10 according to a first embodiment of the present invention.

In the magnetic detector element 11, a base layer 1, an antiferromagnetic layer 2, a pinned magnetic layer 3 including a ferromagnetic layer, a nonmagnetic material layer 4, a free magnetic layer 5, and a protective layer 6 are deposited and stacked in this order on a surface of a substrate. The antiferromagnetic layer 2 has a layered structure in which a PtCr layer 2A, a PtMn layer 2B, and an IrMn layer 2C are stacked in this order such that the IrMn layer 2C is disposed closest to the ferromagnetic layer (the pinned magnetic layer 3). The IrMn layer 2C may be stacked so as to be in contact with the pinned magnetic layer 3. These layers are deposited, for example, using a sputtering process or a CVD process. The deposited layers are subjected to annealing treatment, and exchange coupling is thereby produced between the antiferromagnetic layer 2 and the pinned magnetic layer 3. The antiferromagnetic layer 2 and the pinned magnetic layer 3 form the exchange coupling film 10 in the first embodiment of the present invention.

The magnetic detector element 11 is a stacked element that utilizes a so-called single spin valve giant magnetoresistance effect (GMR effect), and its electrical resistance varies depending on the relative relation between the pinned magnetization vector of the pinned magnetic layer 3 and the magnetization vector of the free magnetic layer 5 that varies depending on an external magnetic field.

The base layer 1 is formed of a NiFeCr alloy (nickel-iron-chromium alloy), Cr, Ta, etc. In the exchange coupling film 10 in the present embodiment, it is preferable to use the NiFeCr alloy in order to increase the magnetic field at which the magnetization direction in the pinned magnetic layer 3 is reversed (this magnetic field is appropriately referred to as "Hex").

The antiferromagnetic layer 2 has the structure in which the PtCr layer 2A, the PtMn layer 2B, and the IrMn layer 2C are stacked together. When the antiferromagnetic layer 2 has this structure, the ratio (M0/Ms) of residual magnetization M0 to saturation magnetization Ms tends to be negative, and its absolute value tends to become large. In this case, the entire hysteresis loop of the exchange coupling film 10 is shifted in the magnetization direction of the exchange coupling magnetic field, and the coercive force Hc decreases. Therefore, in the exchange coupling film 10 obtained, not only the Hex is large, but also the strong-magnetic field resistance is high.

From the viewpoint of allowing the exchange coupling film 10 to have high strong-magnetic field resistance, M0/Ms is preferably −0.05 or less, more preferably −0.10 or less, still more preferably −0.15 or less, and particularly preferably −0.20 or less.

From the viewpoint of increasing the strong-magnetic field resistance of the exchange coupling film 10, the thickness of the PtMn layer 2B may be preferably 12 Å or more, and the thickness of the IrMn layer 2C may be preferably 6 Å or more. Moreover, the sum of the thickness D2 of the PtMn layer 2B and the thickness D3 of the IrMn layer 2C may be preferably 20 Å or more. When at least one of these conditions is satisfied, the tendency of M0/Ms to become negative and the tendency of the absolute value of M0/Ms to increase are significant.

To increase the Hex, it is preferable that the thickness D1 of the PtCr layer 2A in the antiferromagnetic layer 2 is larger than the sum of the thickness D2 of the PtMn layer 2B and the thickness D3 of the IrMn layer 2C. The ratio [D1:(D2+D3)] of the thickness D1 to the sum of the thicknesses D2+D3 is more preferably 5:1 to 100:1 and still more preferably 10:1 to 50:1.

From the viewpoint of increasing the Hex, the PtCr layer 2A is formed of preferably $Pt_\alpha Cr_{100at\%-\alpha}$ ($\alpha$ is from 45 at % to 62 at % inclusive), more preferably $Pt_\alpha Cr_{100at\%-\alpha}$ ($\alpha$ is from 47 at % to 60 at % inclusive), and particularly preferably $Pt_\alpha Cr_{100at\%-\alpha}$ ($\alpha$ is from 50 at % to 57 at % inclusive).

In the present embodiment, the antiferromagnetic layer 2 is subjected to annealing treatment for ordering, and exchange coupling is thereby produced between the antiferromagnetic layer 2 and the pinned magnetic layer 3 (at their interface). The magnetic field due to the exchange coupling (the exchange coupling magnetic field) causes the Hex of the exchange coupling film 10 to increase and the strong-magnetic field resistance to be improved. During the annealing treatment for producing the exchange coupling magnetic field Hex in the exchange coupling film 10, interdiffusion of atoms (Pt, Cr, Mn, and Ir) contained in the PtCr layer 2A, the PtMn layer 2B, and the IrMn layer 2C in the antiferromagnetic layer 2 occurs.

The pinned magnetic layer 3 is formed of a ferromagnetic CoFe alloy (cobalt-iron alloy). The coercive force of the CoFe alloy increases as the content of Fe increases. The pinned magnetic layer 3 contributes to the spin valve giant magnetoresistance effect, and the pinned magnetization direction P of the pinned magnetic layer 3 is the direction of the sensitive axis of the magnetic detector element 11. From the viewpoint of increasing the strong-magnetic field resistance of the exchange coupling film 10, the thickness of the pinned magnetic layer 3 may be preferably from 12 Å to 30 Å inclusive.

The nonmagnetic material layer 4 can be formed using, for example, Cu (copper).

No limitation is imposed on the material and structure of the free magnetic layer 5. For example, a CoFe alloy (cobalt-iron alloy), a NiFe alloy (nickel-iron alloy), etc. may be used as the material of the free magnetic layer 5, and the free magnetic layer 5 formed may have a single layer structure, a layered structure, a layered ferrimagnetic structure.

The protective layer 6 can be formed using, for example, Ta (tantalum).

Second Embodiment

Figure 3:
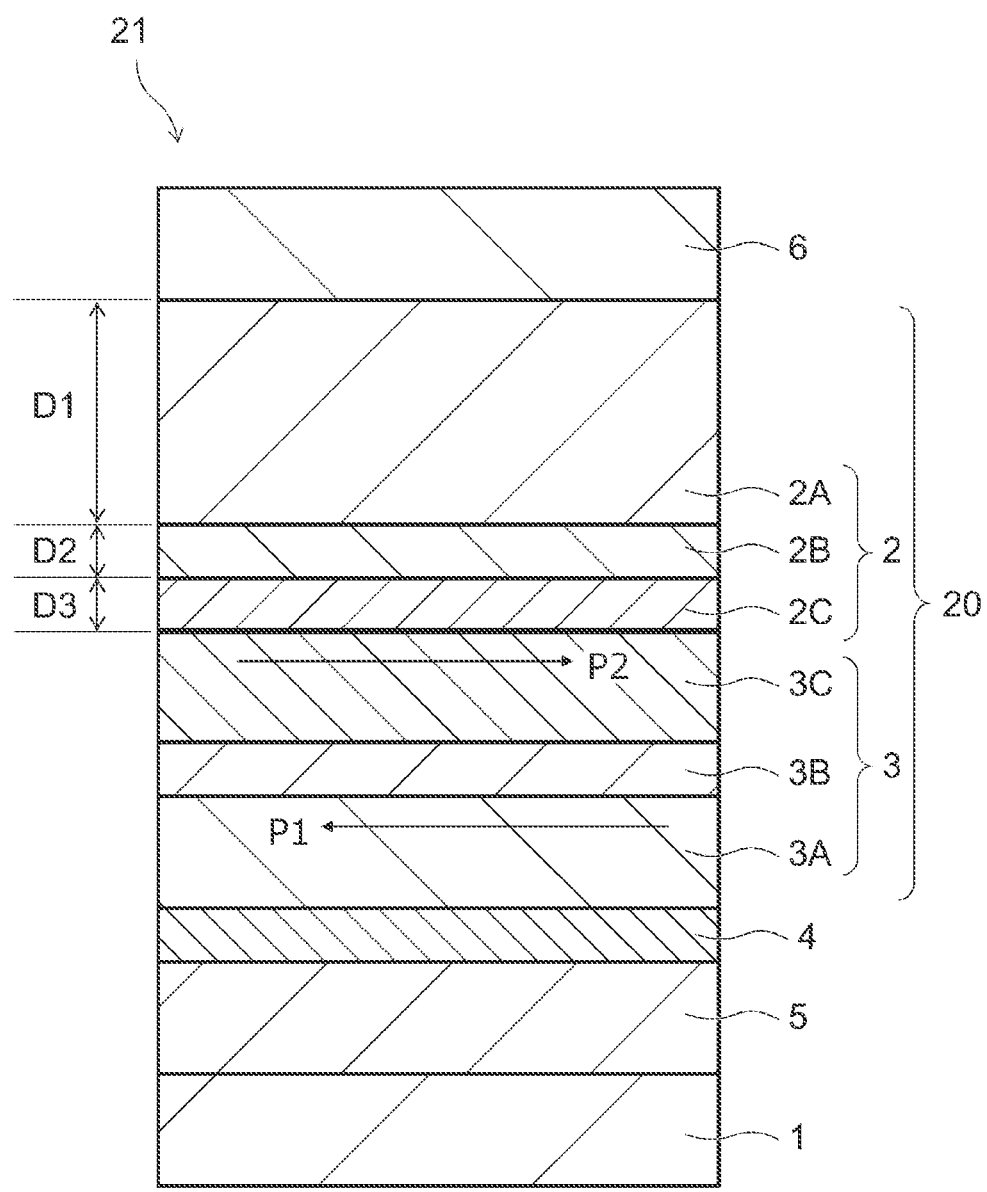
FIG. 3 is an illustration showing the layer structure of an exchange coupling film in a second embodiment of the present invention.

FIG. 3 is an illustration showing the layer structure of a magnetic detector element 21 that uses an exchange coupling film 20 in a second embodiment of the present invention. In the present embodiment, layers having the same functions as those in the magnetic detector element 11 shown in FIG. 2 are denoted by the same numerals, and their description will be omitted.

In the magnetic detector element 21 in the second embodiment, the exchange coupling film 20 is formed by joining a pinned magnetic layer 3 having a self-pinned structure and the antiferromagnetic layer 2 together. The magnetic detector element 21 differs from the magnetic detector element 11 in FIG. 2 in that the nonmagnetic material layer 4 and the free magnetic layer 5 are formed below the pinned magnetic layer 3.

The magnetic detector element 21 is also a stacked element that uses the so-called single spin valve giant magnetoresistance effect. The electrical resistance of the magnetic detector element 21 varies depending on the relative relation between the pinned magnetization vector of a first magnetic layer 3A of the pinned magnetic layer 3 and the magnetization vector of the free magnetic layer 5 that varies depending on an external magnetic field.

The pinned magnetic layer 3 has the self-pinned structure including the first magnetic layer 3A, a second magnetic layer 3C, and a nonmagnetic intermediate layer 3B located between these two layers. The pinned magnetization direction P1 of the first magnetic layer 3A and the pinned magnetization direction P2 of the second magnetic layer 3C are anti-parallel to each other due to interaction therebetween. The pinned magnetization direction P1 of the first magnetic layer 3A adjacent to the nonmagnetic material layer 4 is the pinned magnetization direction of the pinned magnetic layer 3. The pinned magnetization direction P1 is the direction of the sensitive axis of the magnetic detector element 12.

The first magnetic layer 3A and the second magnetic layer 3C are formed of an FeCo alloy (iron-cobalt alloy). The coercive force of the FeCo alloy increases as the content of Fe increases. The first magnetic layer 3A adjacent to the nonmagnetic material layer 4 contributes to the spin valve giant magnetoresistance effect.

The nonmagnetic intermediate layer 3B is formed of, for example, Ru (ruthenium). The thickness of the nonmagnetic intermediate layer 3B formed of Ru is preferably 3 to 5 Å or 8 to 10 Å.

When an alloy layer such as the PtCr layer 2A is formed during production of the exchange coupling film 20, a plurality of metals forming the alloy (Pt and Cr in the case of the PtCr layer 2A) may be supplied simultaneously, or the plurality of metals forming the alloy may be supplied alternately. A specific example of the former is co-sputtering of the plurality of metals forming the alloy, and a specific example of the latter is alternate deposition of different metal films. To increase the Hex, the simultaneous supply of the plurality of metals forming the alloy may be preferred to the alternate supply.

<Structure of Magnetic Sensor>

Figure 4:
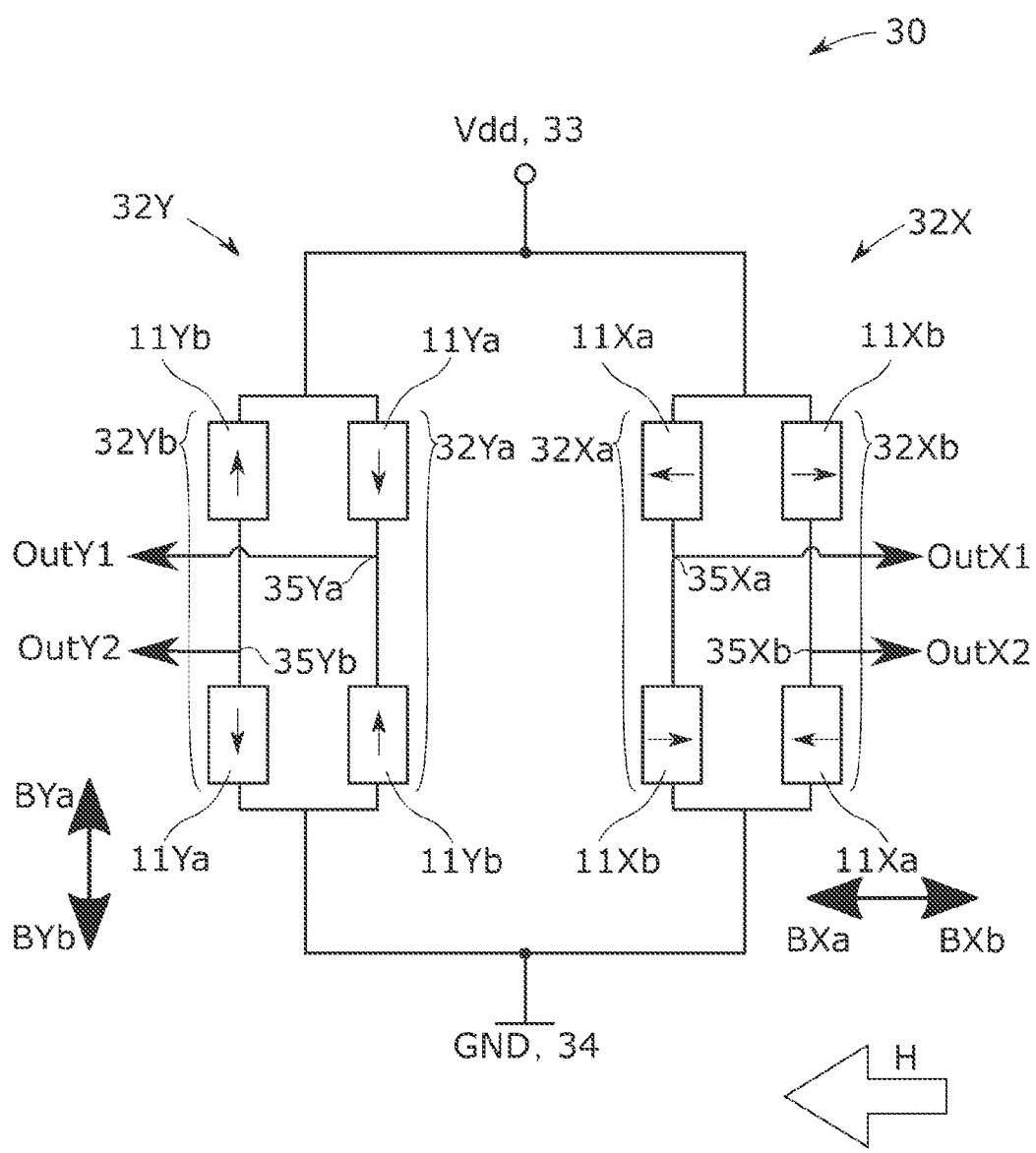
FIG. 4 is a circuit block diagram of a magnetic sensor in an embodiment of the present invention.

FIG. 4 shows a magnetic sensor (magnetic detector) 30 produced by combining a plurality of the magnetic detector elements 11 shown in FIG. 2. In FIG. 4, the magnetic detector elements 11 having different pinned magnetization directions P (see FIG. 2) are distinguished by assigning different numerals 11Xa, 11Xb, 11Ya, and 11Yb. In the magnetic sensor 30, the magnetic detector elements 11Xa, 11Xb, 11Ya, and 11Yb are disposed on a single substrate.

The magnetic sensor 30 shown in FIG. 4 includes a full-bridge circuit 32X and a full-bridge circuit 32Y. The full-bridge circuit 32X includes two magnetic detector elements 11Xa and two magnetic detector elements 11Xb, and the full-bridge circuit 32Y includes two magnetic detector elements 11Ya and two magnetic detector elements 11Yb. The magnetic detector elements 11Xa, 11Xb, 11Ya, and 11Yb each have the layer structure of the exchange coupling film 10 of the magnetic detector element 11 shown in FIG. 2. When these magnetic detector elements are not distinguished from each other, they may be appropriately denoted as the magnetic detector elements 11.

In the full-bridge circuit 32X and the full-bridge circuit 32Y, the magnetic detector elements 11 used have different pinned magnetization directions indicated by arrows in FIG. 4 in order to obtain different magnetic field detection directions, and their magnetic field detection mechanisms are the same. Therefore, in the following description, the mechanism for detecting the magnetic field using the full-bridge circuit 32X will be described.

The full-bridge circuit 32X includes a first series section 32Xa and a second series section 32Xb that are connected in parallel. The first series section 32Xa includes a magnetic detector element 11Xa and a magnetic detector element 11Xb that are connected in series, and the second series section 32Xb includes a magnetic detector element 11Xb and a magnetic detector element 11Xa that are connected in series.

A power supply voltage Vdd is applied to a common power supply terminal 33 shared by the magnetic detector element 11Xa included in the first series section 32Xa and the magnetic detector element 11Xb included in the second series section 32Xb. A common ground terminal 34 shared by the magnetic detector element 11Xb included in the first series section 32Xa and the magnetic detector element 11Xa included in the second series section 32Xb is set to ground potential GND.

The differential output (OutX1)–(OutX2) between the output potential (OutX1) at the midpoint 35Xa of the first series section 32Xa included in the full-bridge circuit 32X and the output potential (OutX2) at the midpoint 35Xb of the second series section 32Xb is obtained as a detected output (detected output voltage) VXs in an X direction.

The full-bridge circuit 32Y operates similarly to the full-bridge circuit 32X, and the differential output (OutY1)–(OutY2) between the output potential (OutY1) at the midpoint 35Ya of a first series section 32Ya and the output potential (OutY2) at the midpoint 35Yb of a second series section 32Yb is obtained as a detected output (detected output voltage) VYs in a Y direction.

As shown by arrows in FIG. 4, the sensitive axis directions of the magnetic detector elements 11Xa and 11Xb forming the full-bridge circuit 32X are orthogonal to the sensitive axis directions of the magnetic detector elements 11Ya and 11Yb forming the full-bridge circuit 32Y.

In the magnetic sensor 30 shown in FIG. 4, the magnetization direction of the free magnetic layer 5 in each of the magnetic detector elements 11 changes so as to be aligned with the direction of the external magnetic field H. In this case, the resistance value of each magnetic detector element 11 varies depending on the vector relation between the pinned magnetization direction P of the pinned magnetic layer 3 and the magnetization direction of the free magnetic layer 5.

For example, when the external magnetic field H is applied in the direction shown in FIG. 4, the electrical resistance values of the magnetic detector elements 11Xa included in the full-bridge circuit 32X decease because their sensitive axis direction coincides with the direction of the external magnetic field H. However, the electrical resistance values of the magnetic detector elements 11Xb increase because their sensitive axis direction is opposite to the direction of the external magnetic field H. As a result of the changes in the electrical resistance, the detected output voltage VXs=(OutX1)–(OutX2) reaches its maximum. As the external magnetic field H changes in a clockwise direction in the plane of the drawing sheet of FIG. 3, the detected output voltage VXs decreases. When the external magnetic field H is directed upward or downward in the plane of the drawing sheet of FIG. 3, the detected output voltage VXs becomes zero.

In the full-bridge circuit 32Y, when the external magnetic field H is directed to the left in the plane of the drawing sheet of FIG. 4, the magnetization directions of the free magnetic layers 5 of all the magnetic detector elements 11 are orthogonal to the sensitive axis direction (the pinned magnetization direction P), and the electrical resistance values of the magnetic detector elements 11Ya and 11Xb are the same. Therefore, the detected output voltage VYs is zero. When the external magnetic field H is applied downward in the plane of the drawing sheet of FIG. 4, the detected output voltage VYs=(OutY1)–(OutY2) from the full-bridge circuit 32Y becomes maximum. As the external magnetic field H changes so as to be directed upward in the plane of the drawing sheet, the detected output voltage VYs decreases.

As described above, as the direction of the external magnetic field H changes, the detected output voltages VXs and VYs of the full-bridge circuits 32X and 32Y change accordingly. Therefore, the direction of movement of a detection target and the amount of its movement (its relative position) can be detected based on the detected output voltages VXs and VYs obtained from the full-bridge circuits 32X and 32Y.

FIG. 4 shows the magnetic sensor 30 that can detect a magnetic field in the X direction and a magnetic field in the Y direction orthogonal to the X direction. However, only one of the full-bridge circuits 32X and 32Y that detect magnetic fields in the X and Y directions, respectively, may be provided.

Figure 5:
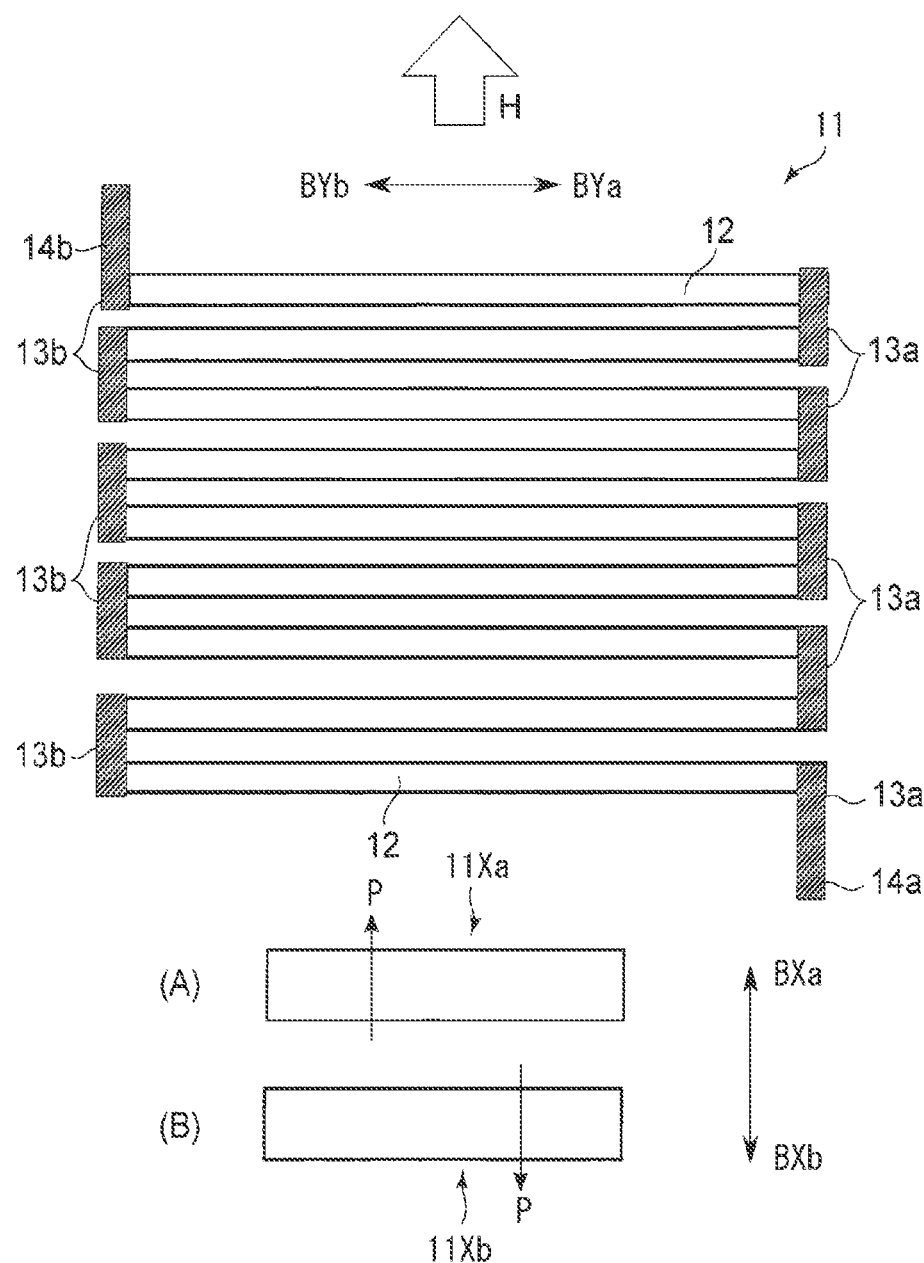
FIG. 5 is a plan view showing magnetic detector elements used for the magnetic sensor.

FIG. 5 shows a plane structure of each of the magnetic detector elements 11Xa and 11Xb. In FIGS. 4 and 5, a BXa-BXb direction corresponds to the X direction. In FIGS. 5(A) and 5(B), the pinned magnetization directions P of the magnetic detector elements 11Xa and 11Xb are indicated by arrows. The pinned magnetization directions P of the magnetic detector elements 11Xa and 11Xb extend in the X direction and are opposite to each other.

As shown in FIG. 5, each of the magnetic detector elements 11Xa and 11Xb includes a plurality of stripe-shaped element portions 12. The longitudinal direction of the element portions 12 coincides with a BYa-BYb direction. The plurality of element portions 12 are arranged parallel to each other, and right ends (in FIG. 5) of adjacent element portions 12 are connected to each other through a conductive member 13a, and left ends (in FIG. 5) of adjacent element portions 12 are connected to each other through a conductive member 13b. At the left and right ends (in FIG. 5) of the element portions 12, the conductive members 13a and 13b, respectively, are connected in an alternating manner, and the element portions 12 are connected to form a so-called meander shape. In each of the magnetic detector elements 11Xa and 11Xb, a lower right conductive member 13a in FIG. 5 is integrated with a connection terminal 14a, and an upper left conductive member 13b in FIG. 5 is integrated with a connection terminal 14b.

Each of the element portions 12 is formed by stacking a plurality of metal layers (alloy layers). FIG. 2 shows the layered structure of the element portions 12. Each of the element portions 12 may have the layered structure shown in FIG. 3.

In the magnetic sensor 30 shown in FIGS. 4 and 5, each of the magnetic detector elements 11 may be replaced with the magnetic detector element 21 in the second embodiment shown in FIG. 3.

The above embodiments have been described for facilitating an understanding of the present invention and do not limit the present invention. Therefore, the elements disclosed in the above embodiments are intended to encompass all design modifications and equivalents belonging to the technical scope of the present invention. For example, in the above exchange coupling films, the IrMn layer 2C is in contact with the pinned magnetic layer 3, i.e., the IrMn layer 2C is stacked directly on the stacked pinned magnetic layer 3. However, another layer containing Mn (examples thereof include a Mn layer and an IrMn layer) may be stacked between the IrMn layer 2C and the pinned magnetic layer 3. In the exchange coupling film according to the present invention, the ferromagnetic layer in contact with the antiferromagnetic layer is not limited to the pinned magnetic layer. For example, the exchange coupling film according to the present invention may include a ferromagnetic layer forming at least part of a free magnetic layer and an antiferromagnetic layer.

EXAMPLES

The present invention will next be described more specifically by way of Examples etc., but the scope of the present invention is not limited to the Examples.

Example 1

Layered bodies 22 (see FIG. 6) each including an exchange coupling film 40 having a layer structure described below were produced for the purpose of evaluating the characteristics of the exchange coupling film 40. In the following Examples, Comparative Examples, and Me Example, parenthesized numerical values represent thicknesses (Å). The exchange coupling film 40 was annealed in a magnetic field of 15 kOe at 350° C. for 20 hours to thereby pin the magnetization of the pinned magnetic layer 3 including a ferromagnetic layer and the magnetization of the antiferromagnetic layer 2.

Substrate/base layer 1: NiFeCr (40)/nonmagnetic material layer 4: [Cu (40)/Ru (20)]/pinned magnetic layer 3: $Co_{40at\%}Fe_{60at\%}$ (20)/antiferromagnetic layer 2 [IrMn layer 2C: $Ir_{22at\%}Mn_{78at\%}$ (D3)/PtMn layer 2B: $Pt_{50at\%}Mn_{50at\%}$ (D2)/PtCr layer 2A: $Pt_{51at\%}Cr_{49at\%}$ (300)]/protective layer 6: Ta (100)

The thickness D2 of the PtMn layer 2B was changed in the range of 6 Å to 2 8 Å. The thickness D3 of the IrMn layer 2C was changed in the range of 4 Å to 10 Å.

Comparative Examples 1-1 and 1-2

Figure 6:
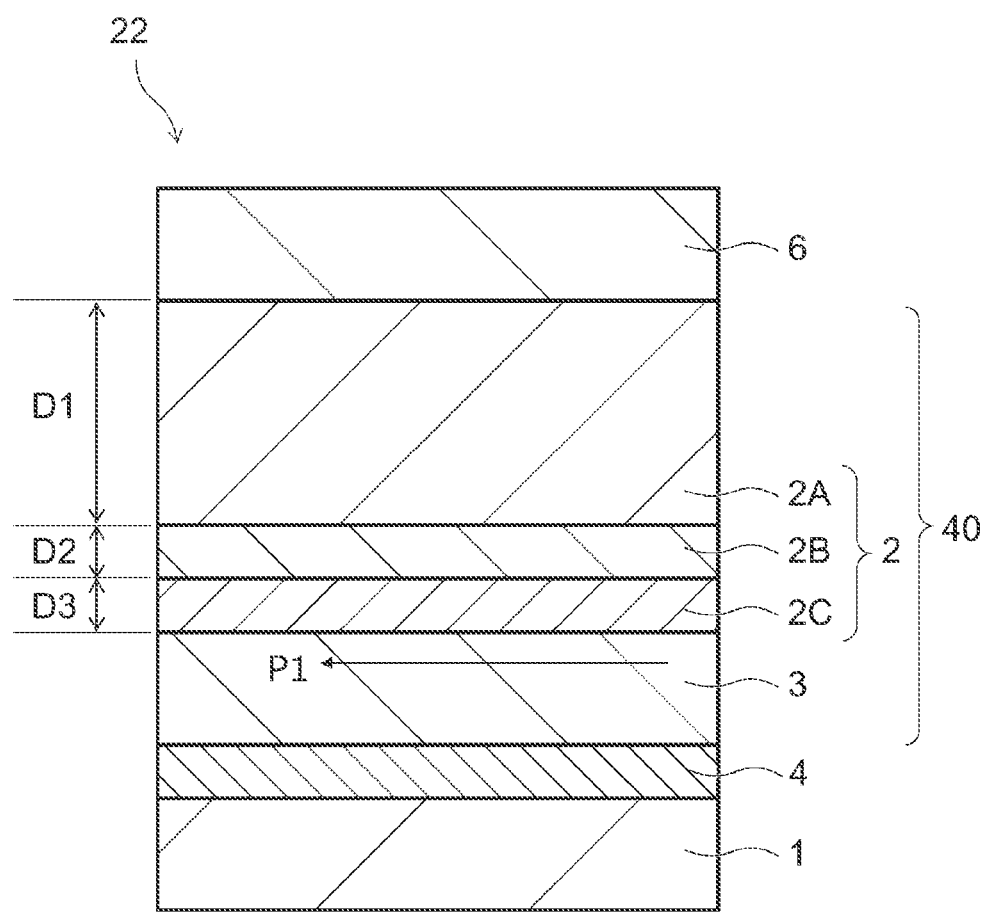
FIG. 6 is an illustration showing the layer structure of a layered body in Example 1.

The order of stacking in the antiferromagnetic layer 2 in the layered body 22 shown in FIG. 6 was changed. Specifically, the PtMn layer 2B, the IrMn layer 2C, and the PtCr layer 2A were stacked from the side close to the pinned magnetic layer 3.

Comparative Example 2

A layered body 22 including an exchange coupling film 40 was obtained in the same manner as in Example 1 except that the antiferromagnetic layer 2 in the layered body 22 shown in FIG. 6 was composed of $Ir_{22at\%}Mn_{78at\%}$ (80).

Comparative Example 3

A layered body 22 including an exchange coupling film 40 was obtained in the same manner as in Example 1 except that the antiferromagnetic layer 2 in the layered body 22 shown in FIG. 6 was composed of $Pt_{50at\%}Mn_{50at\%}$ (300).

Comparative Example 4

A layered body 22 including an exchange coupling film 40 was obtained in the same manner as in Example 1 except that the antiferromagnetic layer 2 in the layered body 22 shown in FIG. 6 was composed of $Pt_{51at\%}Cr_{49at\%}$ (300).

A VSM (vibrating sample magnetometer) was used to measure the magnetization curve of each of the exchange coupling films 40 in the Examples and the Comparative Examples, and the exchange coupling magnetic field Hex (unit: Oe), the coercive force Hc (unit: Oe), the ratio (M0/Ms) of residual magnetization M0 to saturation magnetization Ms, and the ratio (Hex/Hc) of the exchange coupling magnetic field Hex to the coercive force He were determined from the hysteresis loop obtained. The results are shown in Table 1.

TABLE 1

| | IrMn thickness (Å) | PtMn thickness (Å) | IrMn thickness + PtMn thickness (Å) | Base body AF (Å) | Exchange coupling magnetic field Hex (Oe) | Coercive force Hc (Oe) | Residual magnetization M0/saturation magnetization Ms | Hex/Hc |
|---|---|---|---|---|---|---|---|---|
| Example 1-1 | 4 | 10 | 14 | 51PtCr300 | 1120 | 1080 | −0.05 | 1.04 |
| Example 1-2 | 4 | 12 | 16 | | 1458 | 1103 | −0.31 | 1.32 |
| Example 1-3 | 4 | 14 | 18 | | 1615 | 1185 | −0.31 | 1.36 |
| Example 1-4 | 4 | 16 | 20 | | 1515 | 1060 | −0.37 | 1.43 |
| Example 1-5 | 6 | 10 | 16 | | 1130 | 980 | −0.16 | 1.15 |
| Example 1-6 | 6 | 12 | 18 | | 1318 | 1003 | −0.32 | 1.31 |
| Example 1-7 | 6 | 14 | 20 | | 1405 | 1010 | −0.40 | 1.39 |

TABLE 1-continued

| | IrMn thickness (Å) | PtMn thickness (Å) | IrMn thickness + PtMn thickness (Å) | Base body AF (Å) | Exchange coupling magnetic field Hex (Oe) | Coercive force Hc (Oe) | Residual magnetization M0/saturation magnetization Ms — | Hex/Hc — |
|---|---|---|---|---|---|---|---|---|
| Example 1-8 | 6 | 16 | 22 | | 1475 | 1075 | −0.39 | 1.37 |
| Example 1-9 | 8 | 10 | 18 | | 1065 | 935 | −0.15 | 1.14 |
| Example 1-10 | 8 | 12 | 20 | | 1223 | 928 | −0.36 | 1.32 |
| Example 1-11 | 8 | 14 | 22 | | 1290 | 960 | −0.45 | 1.34 |
| Example 1-12 | 8 | 16 | 24 | | 1278 | 973 | −0.42 | 1.31 |
| Example 1-13 | 10 | 10 | 20 | | 888 | 838 | −0.08 | 1.06 |
| Example 1-14 | 10 | 12 | 22 | | 1050 | 900 | −0.28 | 1.17 |
| Example 1-15 | 10 | 14 | 24 | | 1158 | 893 | −0.36 | 1.30 |
| Example 1-16 | 10 | 16 | 26 | | 1173 | 873 | −0.33 | 1.34 |
| Comparative Example 1-1 | 8 | 10 | 18 | 51PtCr300 | 593 | 753 | 0.27 | 0.79 |
| Comparative Example 1-2 | 8 | 14 | 22 | | 760 | 915 | 0.13 | 0.83 |
| Comparative Example 2 | 0 | 0 | 0 | IrMn80 | 650 | 560 | −0.25 | 1.16 |
| Comparative Example 3 | 0 | 0 | 0 | PtMn300 | 750 | 950 | 0.20 | 0.79 |
| Comparative Example 4 | 0 | 0 | 0 | 51PtCr300 | 525 | 675 | 0.10 | 0.78 |

Figure 7:
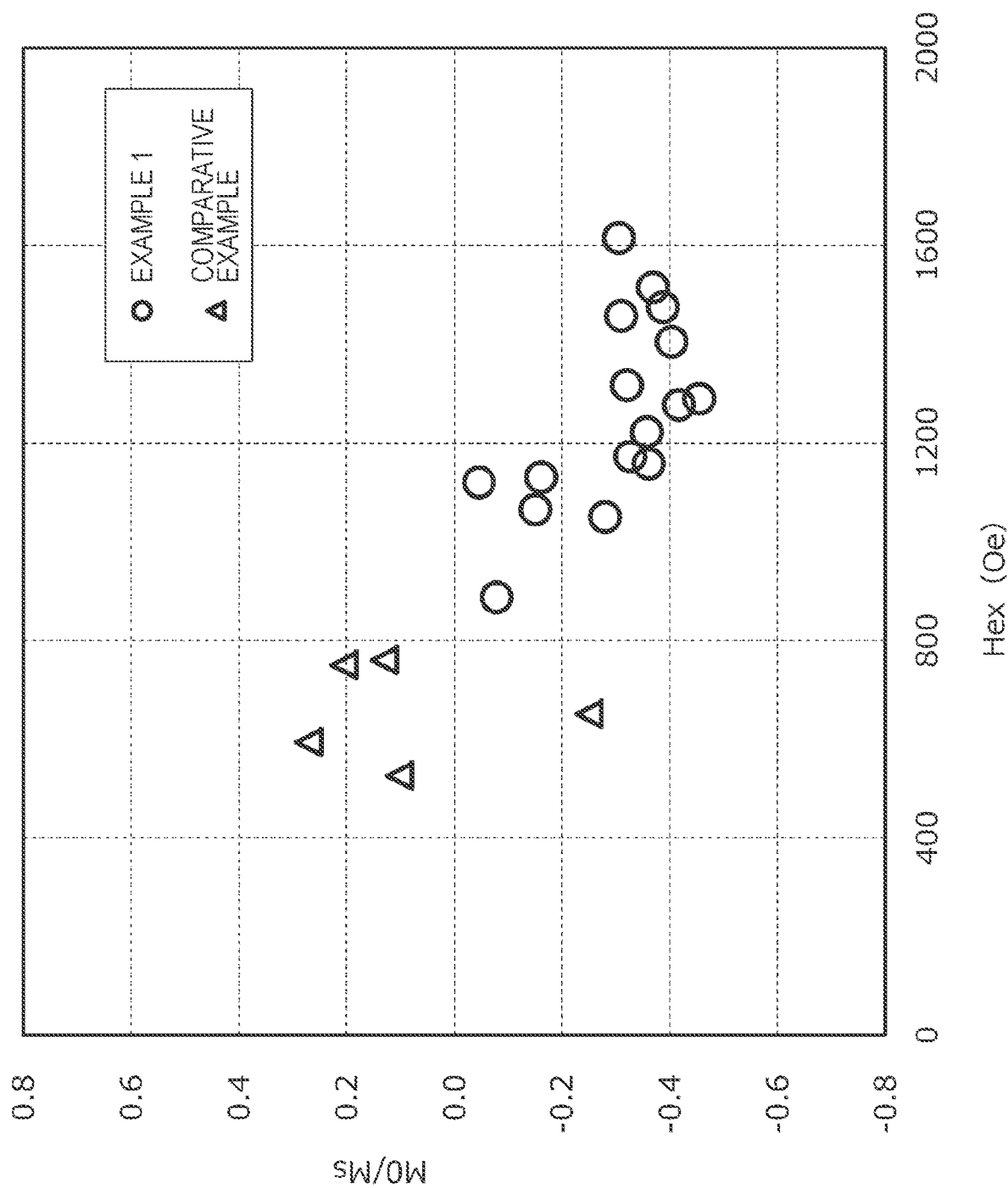
FIG. 7 is a graph showing the relation between M0/Ms and Hex.
Figure 8:
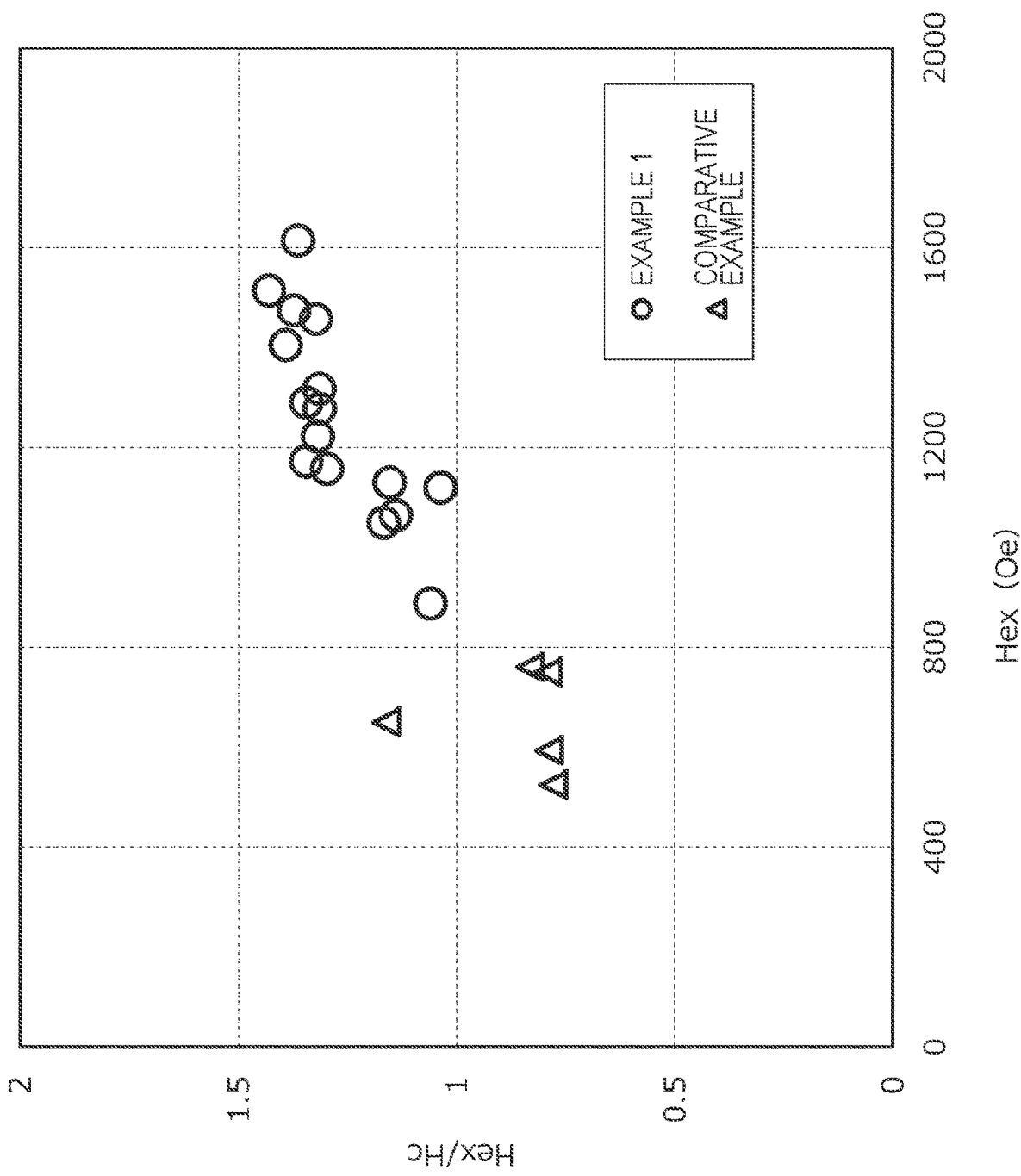
FIG. 8 is a graph showing the relation between Hc/Hex and Hex.

As is clear from FIGS. 7 and 8 that are graphs showing the results in Table 1, in the exchange coupling films 40 each including the antiferromagnetic layer 2 having the structure in Example 1, the exchange coupling magnetic field Hex was large, i.e., 800 Oe or more. Moreover, M0/Ms was negative, and Hex/Hc was larger than 1. Therefore, a magnetic detector element (e.g., a magnetoresistance effect element) including any of the exchange coupling films 40 in Example 1 can exhibit excellent magnetic characteristics even in a high-temperature environment and in a strong magnetic field environment.

Figure 9:
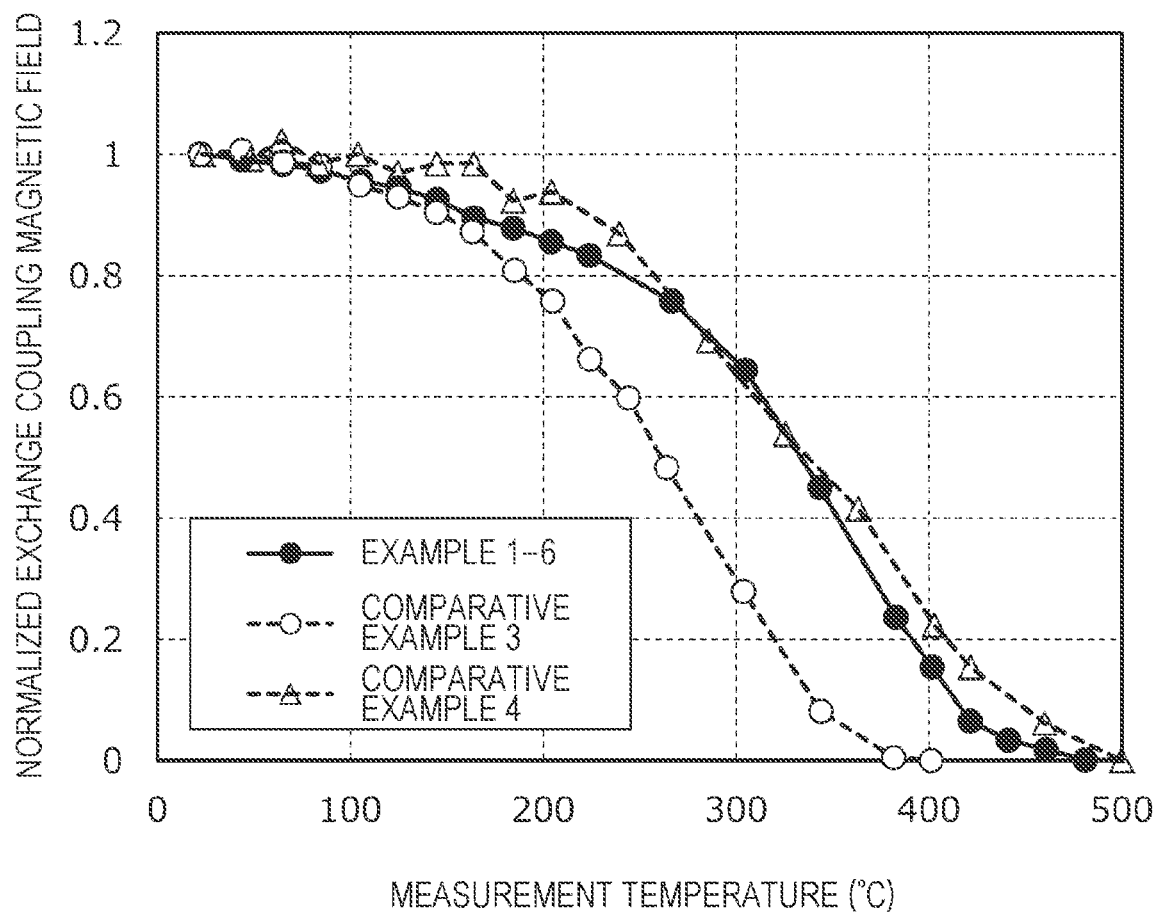
FIG. 9 is a graph showing the relation between a normalized exchange coupling magnetic field and measurement temperature.
Figure 10A:
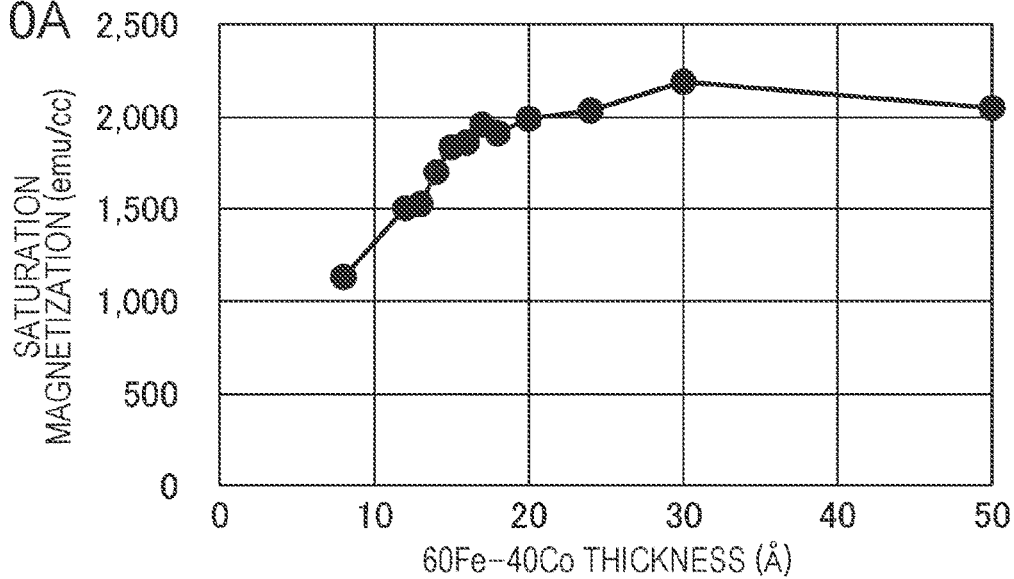
FIG. 10A is a graph showing the relation between saturation magnetization and the thickness of a pinned magnetic layer.
Figure 10B:
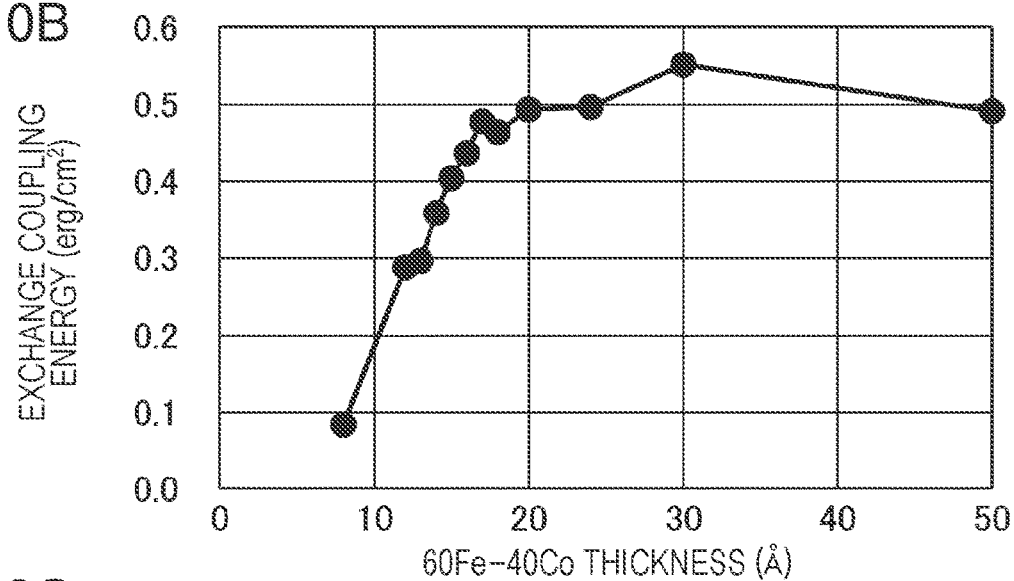
FIG. 10B is graph showing the relation between exchange coupling energy and the thickness of the pinned magnetic layer.
Figure 10C:
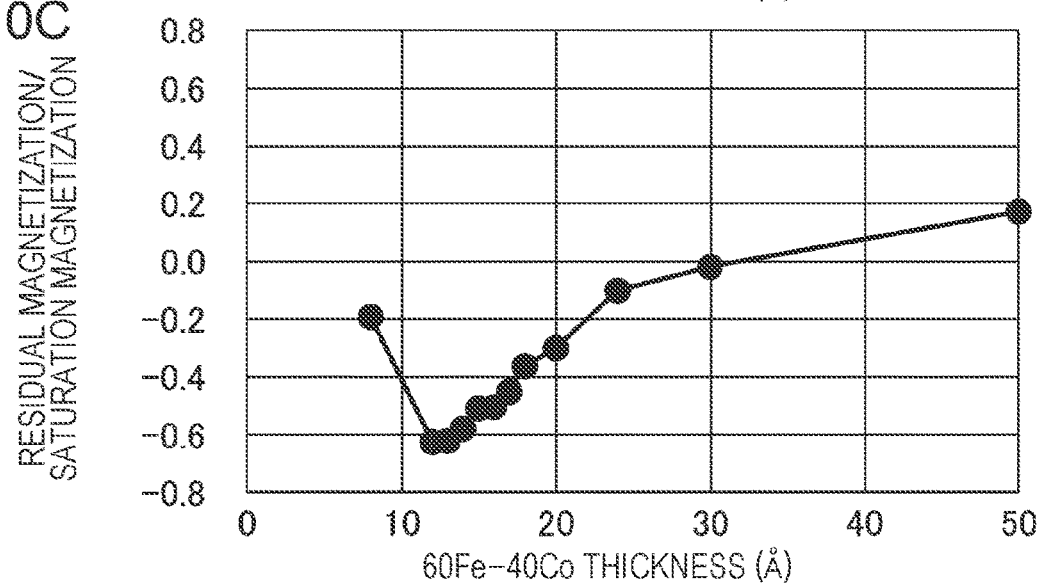
FIG. 10C is a graph showing the relation between residual magnetization/the saturation magnetization and the thickness of the pinned magnetic layer.
Figure 11A:
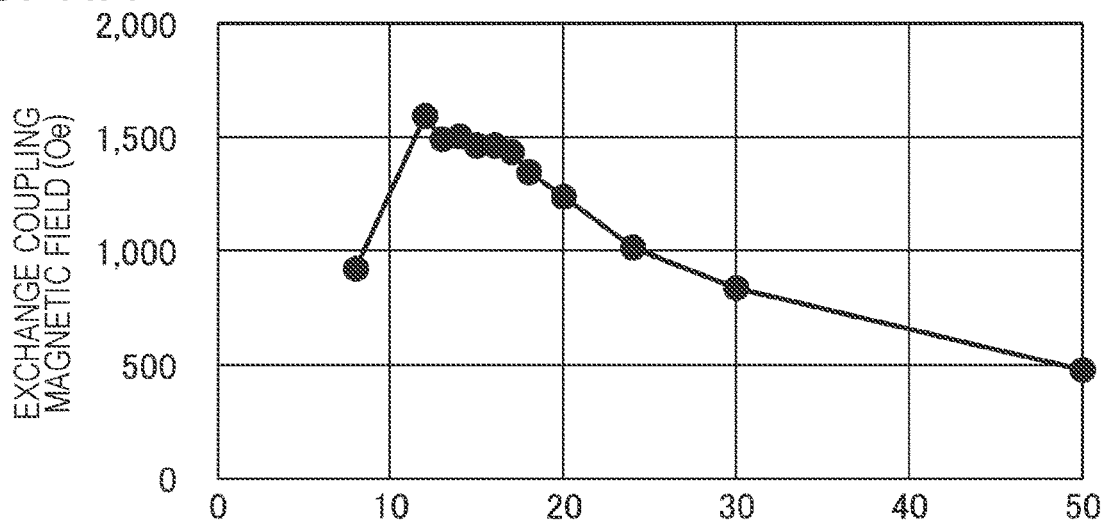
FIG. 11A is a graph showing the relation between an exchange coupling magnetic field and the thickness of the pinned magnetic layer.
Figure 11B:
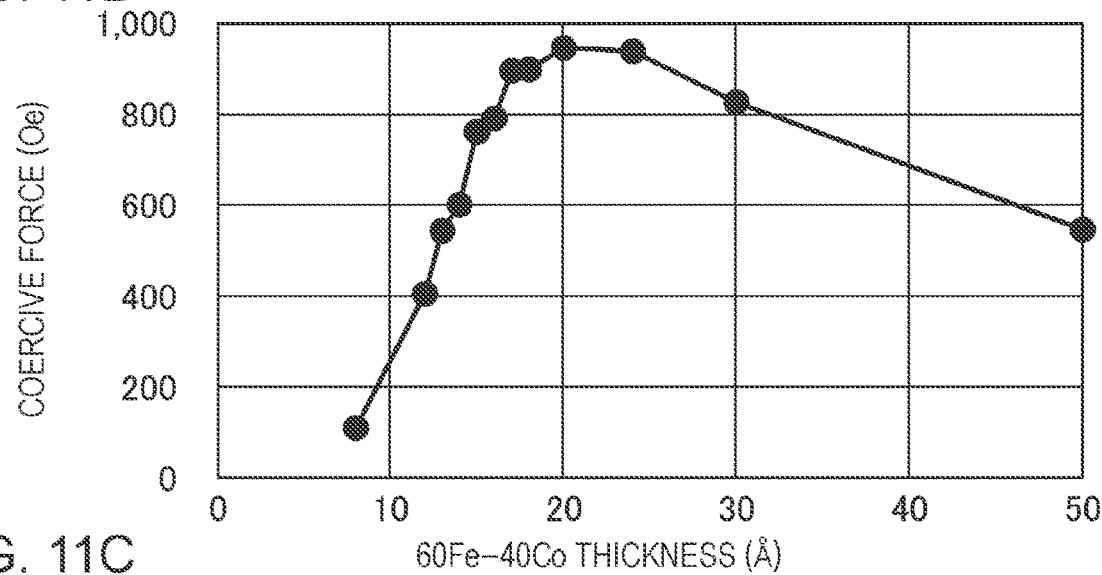
FIG. 11B is a graph showing the relation between coercive force and the thickness of the pinned magnetic layer.
Figure 11C:
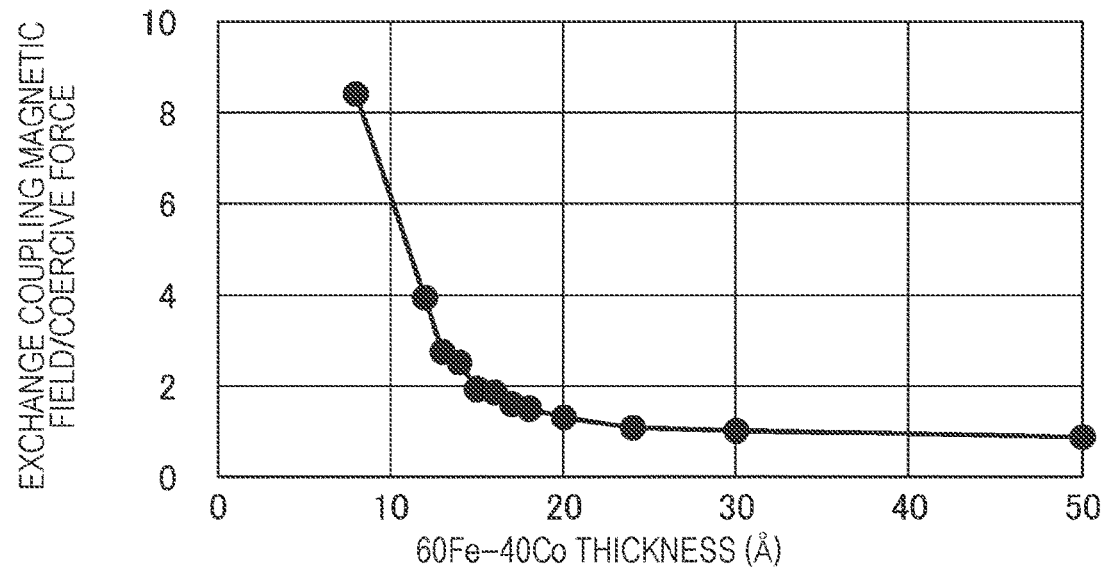
FIG. 11C is a graph showing the relation between the exchange coupling magnetic field/the coercive force and the thickness of the pinned magnetic layer.

In this regard, layered bodies 22 having the same structures as those of the exchange coupling films 40 in Example 1-6 and Comparative Examples 3 and 4 but each including a pinned magnetic layer 3 having a composition of $Co_{90at\%}Fe_{10at\%}$ and a thickness of 100 Å were produced. Each of the layered bodies 22 was placed in a high-temperature environment up to 500° C., and the exchange coupling magnetic field Hex of the exchange coupling film 40 was measured. The measured values at different temperatures were normalized by the measured values at room temperature, and the results are shown in FIG. 9.

Example 2

Layered bodies 22 having the following structure were produced.

Substrate/base layer 1: NiFeCr (40)/nonmagnetic material layer 4: [Cu (40)/Ru (10)]/pinned magnetic layer 3: $Co_{40at\%}Fe_{60at\%}$/antiferromagnetic layer 2 [IrMn layer 2C: $Ir_{20at\%}Mn_{80at\%}$, (8)/PtMn layer 2B: $Pt_{48at\%}Mn_{52at\%}$ (14)/PtCr layer 2A: $Pt_{51at\%}Cr_{49at\%}$ (300)]/protective layer 6: Ta (100)

In the layered bodies 22 prepared, the thickness of the pinned magnetic layer 3 was changed in the range of 8 Å to 50 Å. Each layered body 22 was annealed in a magnetic field of 15 kOe at 350° C. for 20 hours to thereby pin the magnetization of the pinned magnetic layer 3 and the magnetization of the antiferromagnetic layer 2.

A VSM (vibrating sample magnetometer) was used to measure and compute the saturation magnetization Ms (unit: emu/cc), exchange coupling magnetic field Hex (unit: Oe), exchange coupling energy J (unit: erg/cm²), and coercive force Hc (unit: Oe) of the exchange coupling film 10, the ratio (M0/Ms) of the residual magnetization M0 to the saturation magnetization Ms, and the ratio (Hex/Hc) of the exchange coupling magnetic field Hex to the coercive force Hc. The results are shown in Table 2.

TABLE 2

| | CoFe thickness (Å) | Saturation magnetization (emu/cc) | Exchange coupling magnetic field Hex (Oe) | Exchange coupling energy J (erg/cm²) | Coercive force Hc (Oe) | Residual magnetization M0/saturation magnetization Ms | Exchange coupling magnetic field Hex/coercive force Hc |
|---|---|---|---|---|---|---|---|
| Example 2-1 | 8 | 1128 | 925 | 0.08 | 110 | −0.19 | 8.41 |
| Example 2-2 | 12 | 1500 | 1595 | 0.29 | 405 | −0.63 | 3.94 |
| Example 2-3 | 13 | 1523 | 1493 | 0.30 | 543 | −0.62 | 2.75 |
| Example 2-4 | 14 | 1696 | 1505 | 0.36 | 600 | −0.58 | 2.51 |
| Example 2-5 | 15 | 1833 | 1465 | 0.40 | 760 | −0.51 | 1.93 |
| Example 2-6 | 16 | 1859 | 1465 | 0.44 | 790 | −0.50 | 1.85 |
| Example 2-7 | 17 | 1956 | 1435 | 0.48 | 895 | −0.45 | 1.60 |
| Example 2-8 | 18 | 1910 | 1348 | 0.46 | 898 | −0.36 | 1.50 |
| Example 2-9 | 20 | 1988 | 1240 | 0.49 | 945 | −0.30 | 1.31 |

TABLE 2-continued

| | CoFe thickness (Å) | Saturation magnetization (emu/cc) | Exchange coupling magnetic field Hex (Oe) | Exchange coupling energy J (erg/cm$^2$) | Coercive force Hc (Oe) | Residual magnetization M0/saturation magnetization Ms | Exchange coupling magnetic field Hex/ coercive force Hc |
|---|---|---|---|---|---|---|---|
| Example 2-10 | 24 | 2031 | 1018 | 0.50 | 938 | −0.10 | 1.09 |
| Example 2-11 | 30 | 2188 | 840 | 0.55 | 825 | −0.02 | 1.02 |
| Example 2-12 | 50 | 2045 | 480 | 0.49 | 545 | 0.17 | 0.88 |

As is clear from Table 2 and FIGS. 10A to 10C and 11A to 11C prepared based on Table 2, the characteristics of the exchange coupling film 40 vary depending on the thickness of the pinned magnetic layer 3. As can be seen from the results in Example 2, it is preferable from the viewpoint of stably obtaining an increase in the exchange coupling magnetic field Hex and a negative ratio M0/Ms, the thickness of the pinned magnetic layer 3 is from 12 Å to 30 Å inclusive.

Example 3

Figure 12:
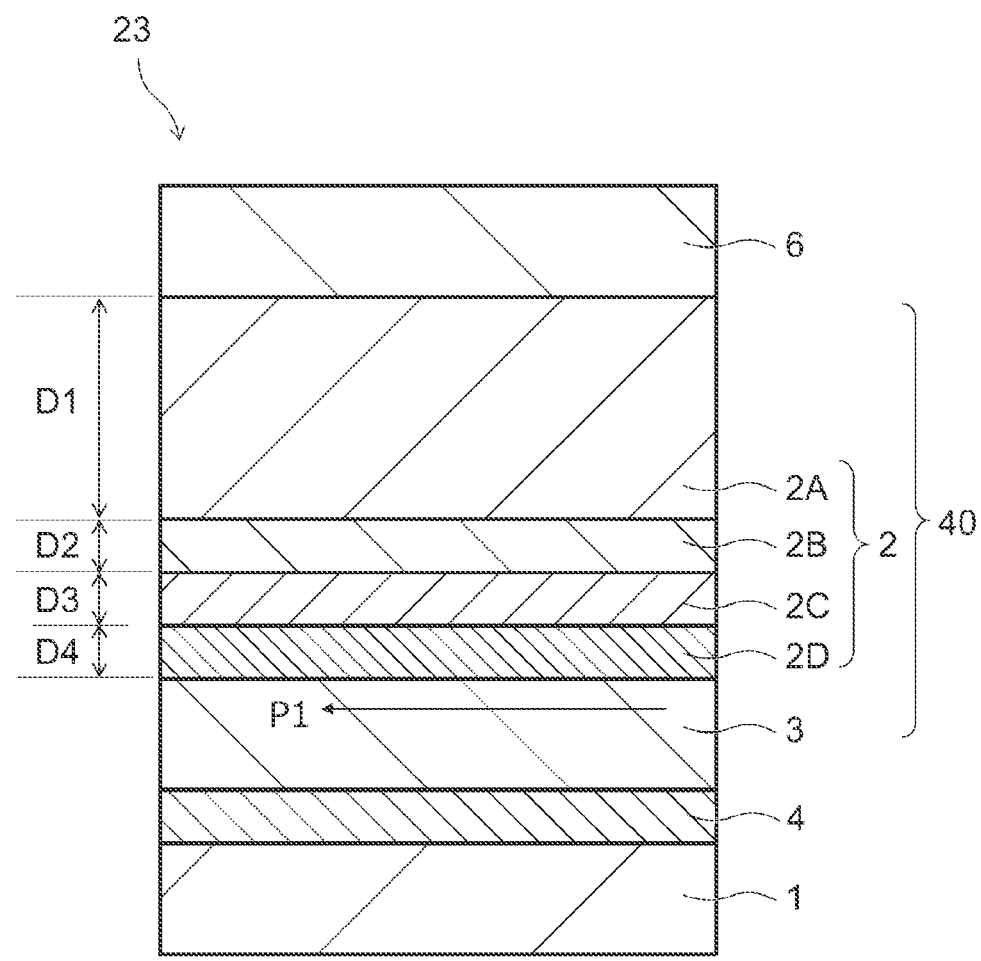
FIG. 12 is an illustration showing the layer structure of a layered body in Example 3.

Layered bodies 23 (see FIG. 12) each including an exchange coupling film 40 having a layer structure described below were produced for the purpose of evaluating the characteristics of the exchange coupling film 40. The exchange coupling film 40 was placed in a magnetic field of 15 kOe and annealed at 350° C. for 20 hours to pin the magnetization of the pinned magnetic layer 3 and the magnetization of the antiferromagnetic layer 2.

Substrate/base layer 1: NiFeCr (40)/nonmagnetic material layer 4: [Cu (40)/Ru (10)]/pinned magnetic layer 3: Co$_{40at\%}$Fe$_{60at\%}$ (20)/antiferromagnetic layer 2 [PtMn layer 2D: Pt$_{50at\%}$Mn$_{50at\%}$ (D4)/IrMn layer 2C: Ir$_{22at\%}$Mn$_{78at\%}$ (D3)/PtMn layer 2B: Pt$_{50at\%}$Mn$_{50at\%}$ (12)/PtCr layer 2A: Pt$_{51at\%}$Cr$_{49at\%}$ (300)]/protective layer 6: Ta (100)

The thickness D4 of the PtMn layer 2D was changed in the range of 2 Å to 8 Å. The thickness D3 of the IrMn layer 2C was changed in the range of 6 Å to 10 Å.

A VSM (vibrating sample magnetometer) was used to measure the magnetization curve of each of the exchange coupling films 40 in Example 3. The exchange coupling magnetic field Hex (unit: Oe), the coercive force Hc (unit: Oe), the ratio (M0/Ms) of the residual magnetization M0 to the saturation magnetization Ms, and the ratio (Hex/Hc) of the exchange coupling magnetic field Hex to the coercive force He were determined from the hysteresis loop obtained. The results are shown in Table 3.

As can be seen, when the PtMn layer 2D is stacked closer to the pinned magnetic layer 3 than the IrMn layer 2C, the ratio of the residual magnetization M0 to saturation magnetization Ms is negative, and its absolute value tends to be large. Moreover, the value of Hex/Hc is positive, and its absolute value tends to be large.

Measurement Example 1

An Auger electron spectrometer was used to perform surface analysis on the layered body 22 in Example 1-16 while the layered body 22 was sputtered with argon from the protective layer 6 side to thereby obtain the distributions of concentrations (the depth profiles) of Pt, Ir, Cr, and Mn in the depth direction. The argon sputtering rate in terms of SiO$_2$ was determined and was 1.1 nm/minute.

Figure 13:
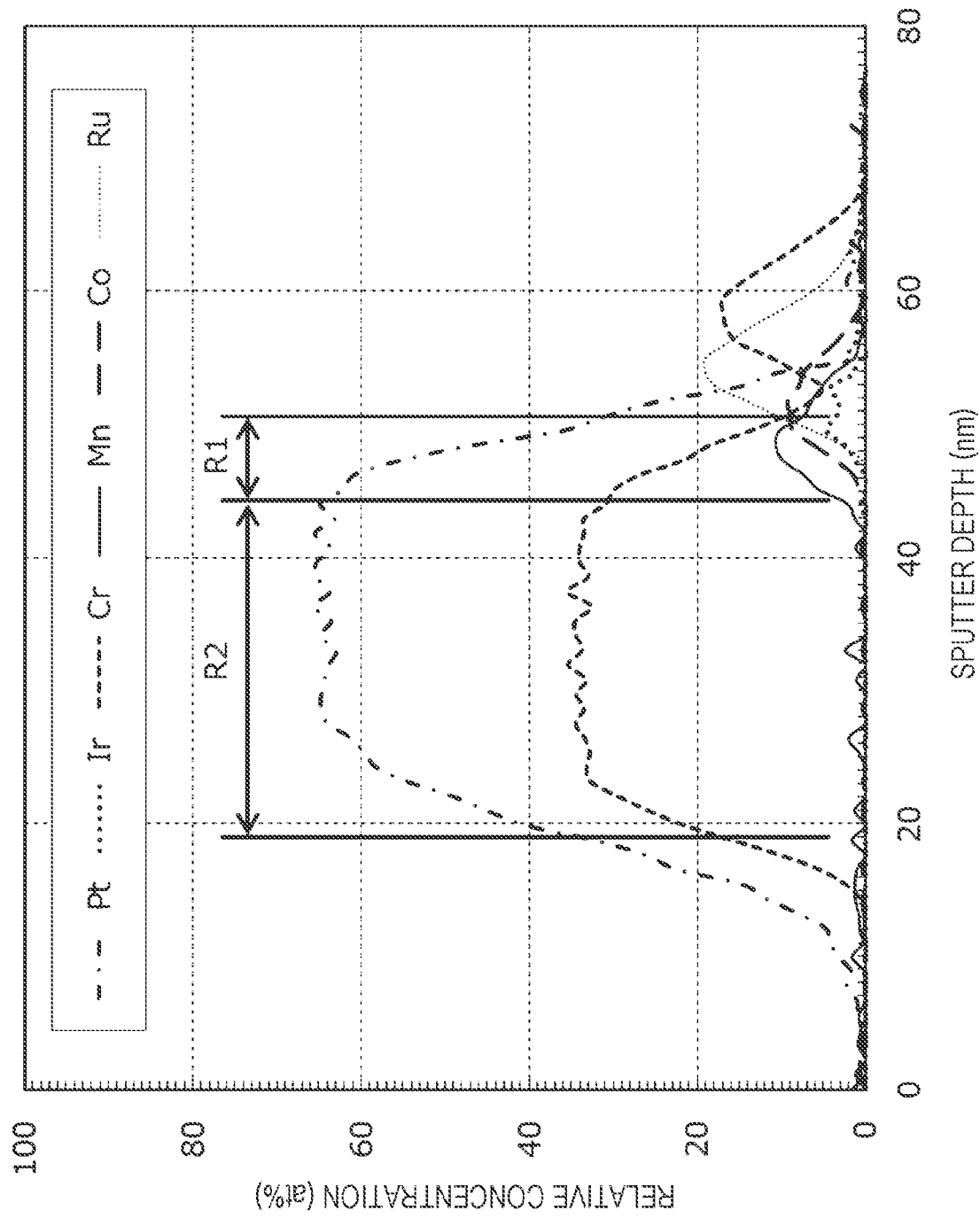
FIG. 13 shows depth profiles in a layered body in Example 1-16.
Figure 14:
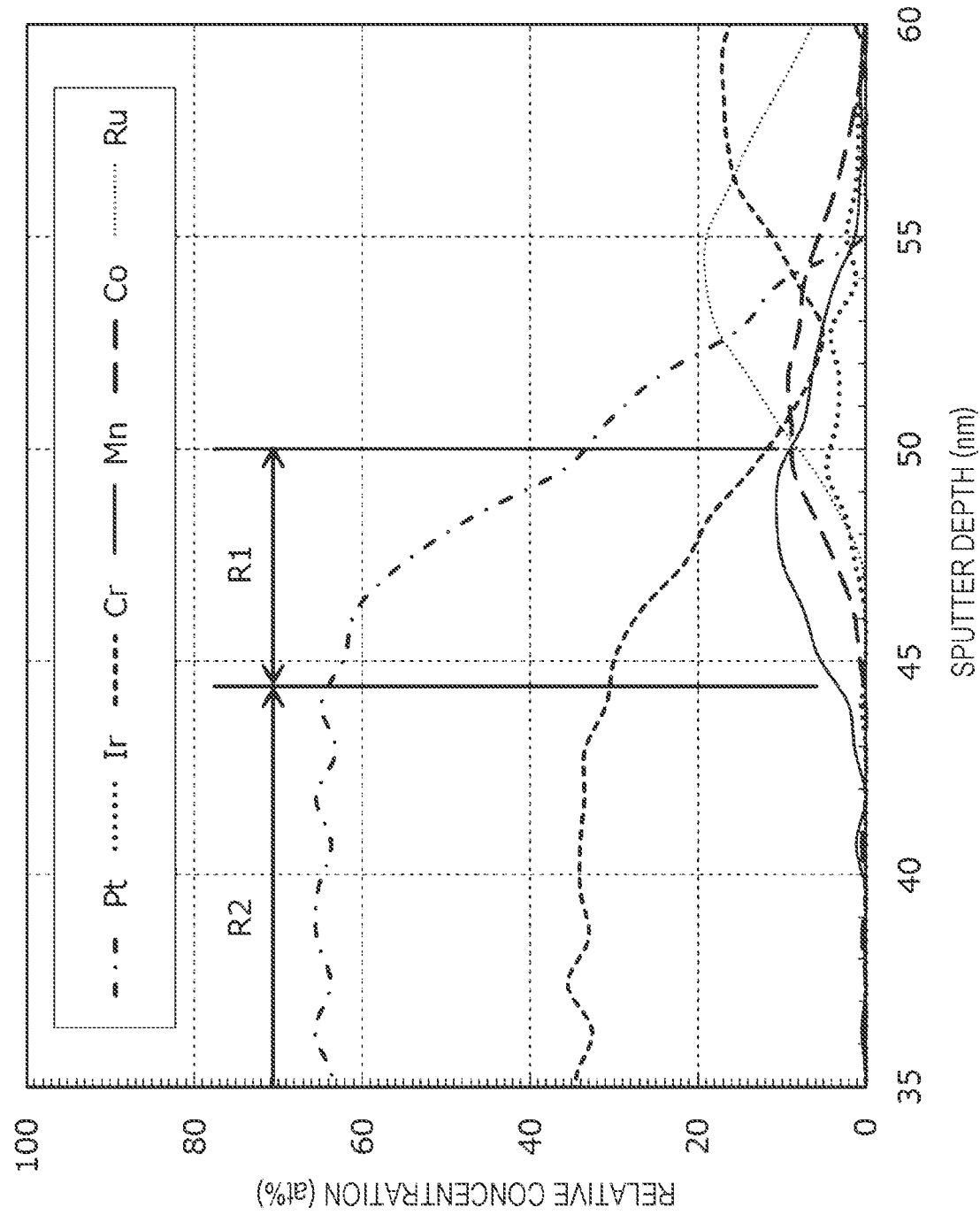
FIG. 14 shows profiles obtained by enlarging part of the depth profiles in FIG. 13.

FIG. 13 shows depth profiles in the layered body 22 in Example 1-16. FIG. 14 is a partially enlarged view of FIG. 13. In these figures, to determine the depth positions of the pinned magnetic layer 3 and the nonmagnetic material layer 4, the depth profiles of Co (one of the constituent elements of the pinned magnetic layer 3) and Ru (the constituent element forming the antiferromagnetic layer 2 side of the nonmagnetic material layer 4) are included. As can be seen from FIG. 13, in the layered body 22 in Example 1-16, the antiferromagnetic layer 2 is located in the depth range of about 20 nm to about 50 nm. The thickness of the antiferromagnetic layer 2 in the layered body 22 in Example 1-16 at the time of deposition is 32.6 nm. This shows that the accuracy of the depth plotted on the horizontal axis of the depth profile is appropriate.

The antiferromagnetic layer 2 includes the X(Cr—Mn) layer containing Mn and Cr and further containing Pt and Ir as one or two or more elements X selected from the group consisting of Ni and platinum-group elements. Specifically, the antiferromagnetic layer 2 was a (Pt—Ir)(Cr—Mn) layer. As can be seen, the X(Cr—Mn) layer ((Pt—Ir)(Cr—Mn)

TABLE 3

| | PtMn thickness (Å) | IrMn thickness (Å) | PtMn thickness (Å) | IrMn thickness + PtMn thicknesses (Å) | Base body AF (Å) | Exchange coupling magnetic field Hex (Oe) | Coercive force Hc (Oe) | Residual magnetization M0/saturation magnetization Ms | Hex/Hc |
|---|---|---|---|---|---|---|---|---|---|
| Example 3-1 | 2 | 6 | 12 | 20 | 51PtCr300 | 1378 | 1023 | −0.36 | 1.35 |
| Example 3-2 | 2 | 8 | 12 | 22 | | 1253 | 938 | −0.34 | 1.34 |
| Example 3-3 | 2 | 10 | 12 | 24 | | 1073 | 878 | −0.22 | 1.22 |
| Example 3-4 | 4 | 6 | 12 | 22 | | 1460 | 1135 | −0.33 | 1.29 |
| Example 3-5 | 4 | 8 | 12 | 24 | | 1265 | 935 | −0.34 | 1.35 |
| Example 3-6 | 4 | 10 | 12 | 26 | | 1080 | 905 | −0.25 | 1.19 |
| Example 3-7 | 8 | 6 | 12 | 26 | | 1563 | 1188 | −0.31 | 1.32 |
| Example 3-8 | 8 | 8 | 12 | 28 | | 1390 | 1035 | −0.29 | 1.34 |
| Example 3-9 | 8 | 10 | 12 | 30 | | 1210 | 915 | −0.32 | 1.32 | layer) includes a first region R1 closer to the pinned magnetic layer 3 and a second region R2 farther from the pinned magnetic layer 3, and the content of Mn in the first region R1 is higher than the content of Mn in the second region R2.

The region in which the Mn content is higher (the first region R1) is present in a region closer to the pinned magnetic layer 3, i.e., is disposed in contact with the pinned magnetic layer 3. This may be the reason that the exchange coupling magnetic field Hex is high in the exchange coupling film 40 of the layered body 22 in Example 1-16. The region in which the Mn content is lower and the Cr content is higher, i.e., the region containing substantially no Mn and containing Cr, is present as the second region R2. This may be the reason that the blocking temperature of the antiferromagnetic layer 2 is high.

Figure 15:
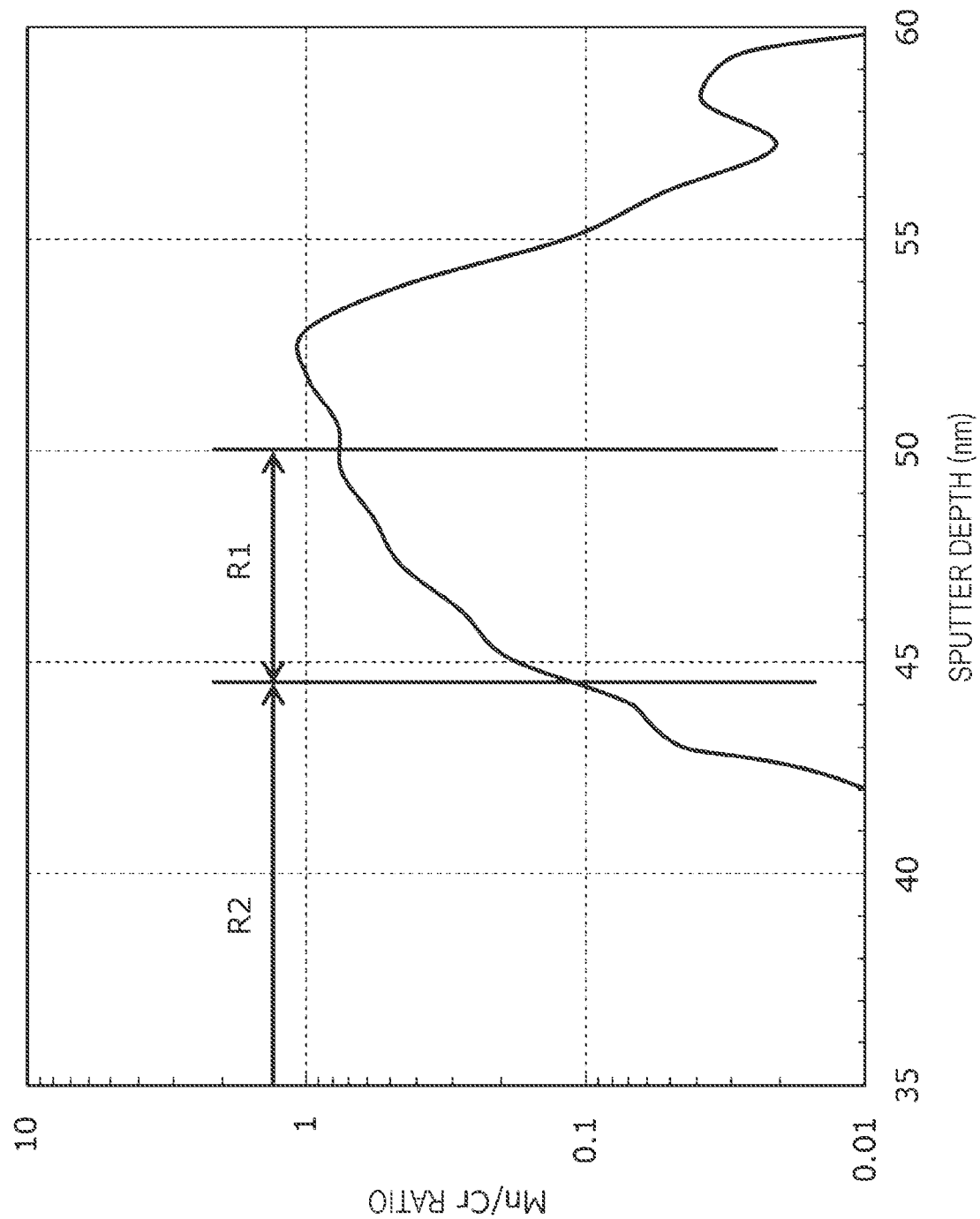
FIG. 15 is a graph showing the ratio of the content of Mn to the content of Cr (Mn/Cr ratio) with the range of the horizontal axis set to be equal to that in FIG. 14.

FIG. 15 is a graph showing the ratio of the content of Mn to the content of Cr (Mn/Cr ratio) with the range of the horizontal axis set to be equal to that in FIG. 14. The Mn content and the Cr content were computed using the Mn content and the Cr content at different depths determined from the depth profiles. In the present specification, based on the results shown in FIG. 15, the depth at which the Mn/Cr ratio is 0.1 is defined as the boundary between the first region R1 and the second region R2. Specifically, in the antiferromagnetic layer 2, a region which is closer to the pinned magnetic layer 3 and in which the Mn/Cr ratio is 0.1 or more is defined as the first region R1, and a region of the antiferromagnetic layer 2 other than the first region is defined as the second region. According to these definitions, in the layered body 22 in Example 1-16, the boundary between the first region R1 and the second region R2 is located at a depth of about 44.5 nm.

The large Mn/Cr ratio may not only affect the magnitude of the exchange coupling magnetic field Hex but also contribute to an improvement in the hysteresis characteristics of the exchange coupling film 40 of the layered body 22. Specifically, the larger the Mn/Cr ratio, the more likely the ratio of the residual magnetization M0 to saturation magnetization Ms is to be negative and its absolute value is to be large, and the more likely the absolute value of Hex/Hc, which is positive, to be large. More specifically, the first region R1 includes a region with a Mn/Cr ratio of preferably 0.3 or more, more preferably 0.7 or more, and particularly preferably 1 or more.

Since the thickness of the pinned magnetic layer 3 is 20 Å (2 nm), the boundary between the antiferromagnetic layer 2 and the pinned magnetic layer 3 was set to a position (depth: 50 nm) shifted 1 nm from the position of the maximum value of the content of Co contained in the pinned magnetic layer 3 toward the antiferromagnetic layer 2. It is probable that diffusion of Mn in the first region R1 into the second region R2 occurs preferentially during ordering by annealing. Therefore, the boundary between the first region R1 and the second region R2 was not defined based on the peak of the Mn content. The thus-defined thickness of the first region R1 was about 5.5 nm (50 nm to 44.5 nm).

For confirmation purposes, the depth profiles were similarly obtained for a film obtained in the course of producing the layered body 22 in Example 1-16. Specifically, the depth profiles were obtained for a layered body (unannealed layered body) including the layers for producing the exchange coupling film 40 in Example 1-16 and not subjected to annealing. The results are shown in FIGS. 16 to 18.

Figure 16:
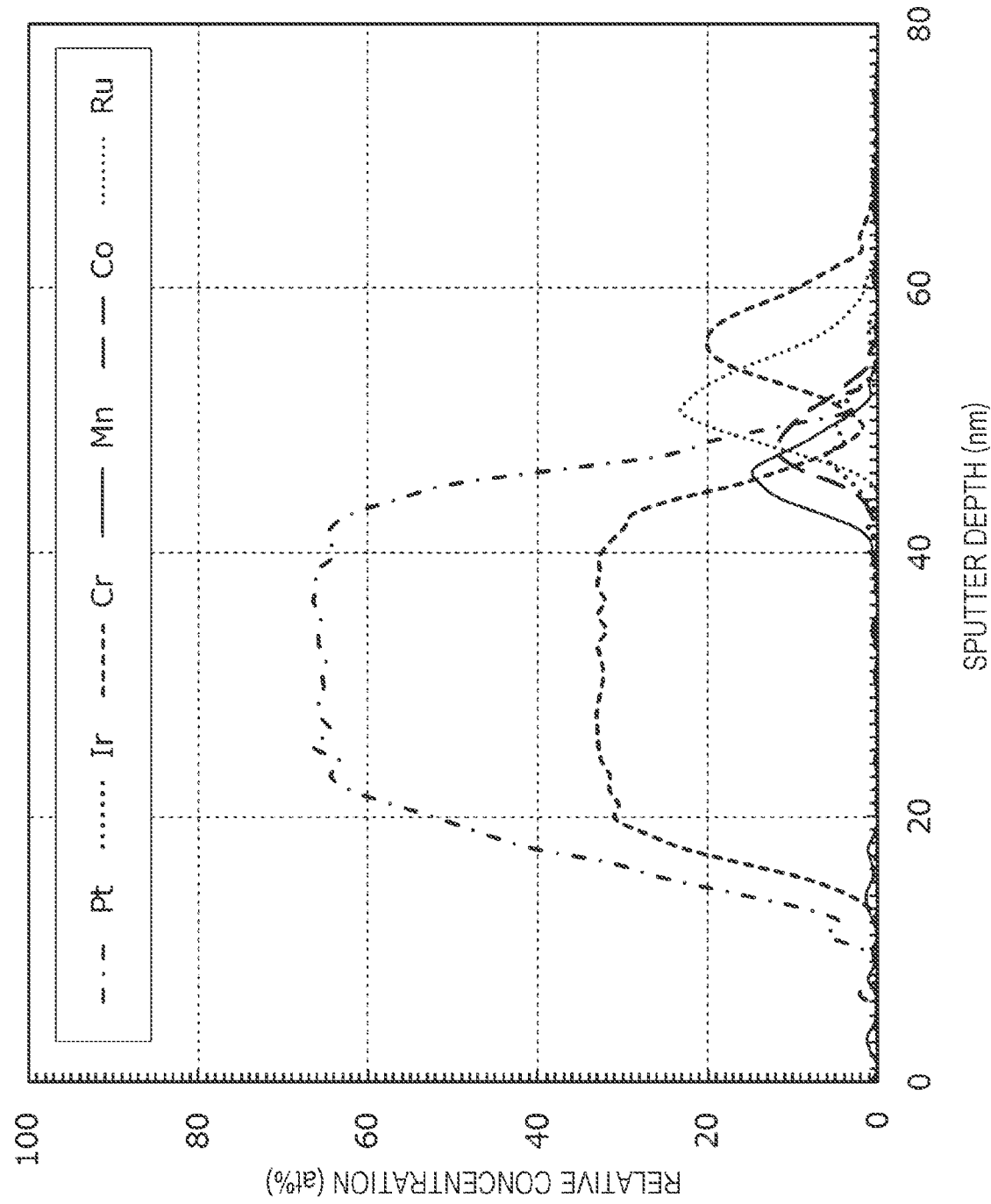
FIG. 16 shows depth profiles in an unannealed layered body obtained in the course of producing the layered body in Example 1-16.
Figure 17:
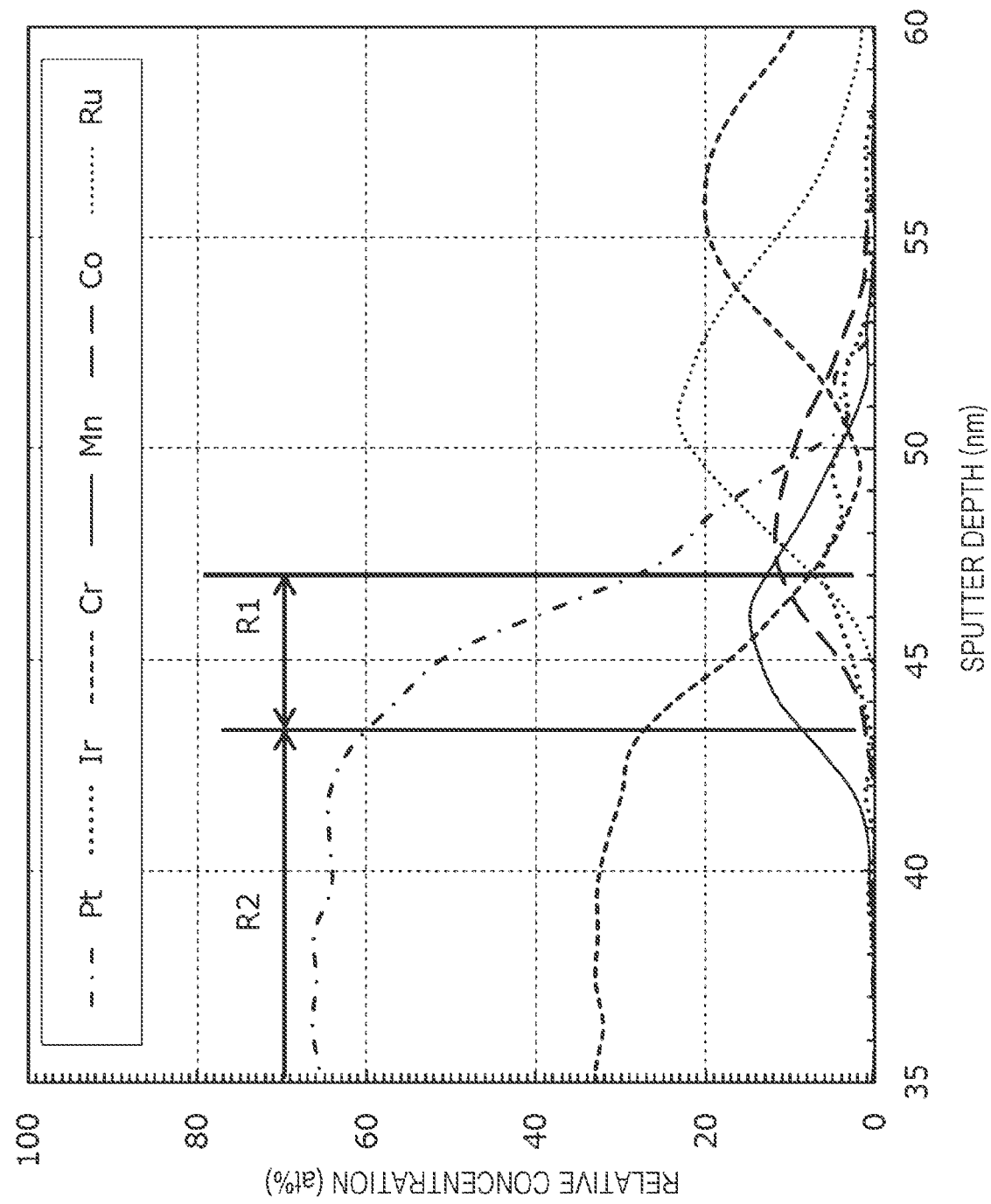
FIG. 17 shows profiles obtained by enlarging part of the depth profile in FIG. 16.
Figure 18:
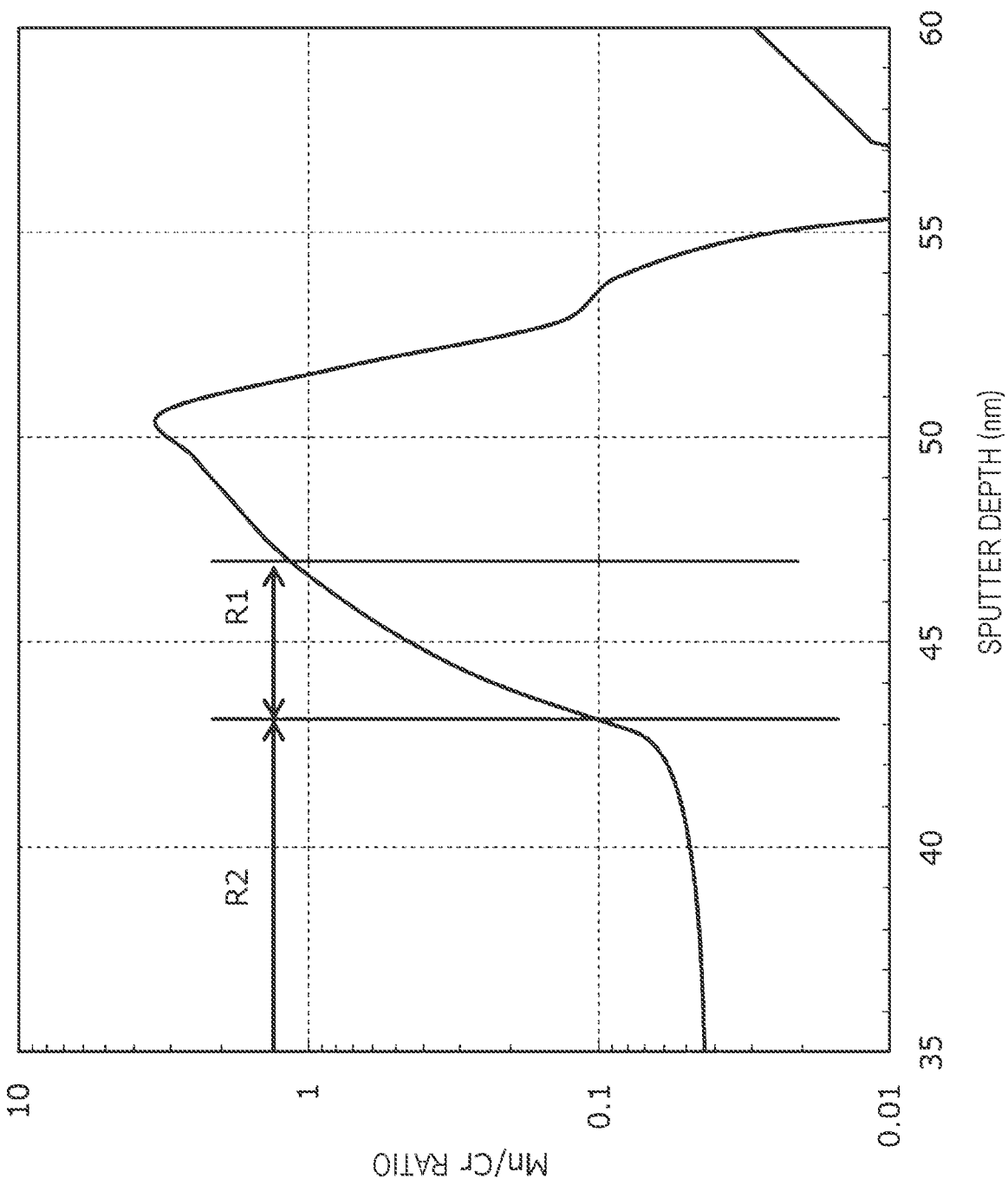
FIG. 18 is a graph showing the ratio of the content of Mn to the content of Cr (Mn/Cr ratio) with the range of the horizontal axis set to be equal to that in FIG. 17.

As shown in FIGS. 16 to 18, the boundary between the first region R1 and the second region R2 in the antiferromagnetic layer 2 is located at a depth of 43 nm, and the boundary between the antiferromagnetic layer 2 and the pinned magnetic layer 3 is located at a depth of 47 nm. As shown in FIG. 17, the peak of the Mn content in the first region R1 has a shape obtained by combining a peak at a depth of about 44 nm and a peak at a depth of about 46 nm. These peaks may correspond to the PtMn layer 2B and the IrMn layer 2C. The thickness of the first region R1 in the antiferromagnetic layer 2 in the unannealed layered body is about 3 nm (47 nm-44 nm). This is narrower than the thickness (about 5.5 nm) of the first region R1 in the antiferromagnetic layer 2 of the layered body 22, and this difference may be caused by diffusion of Mn into the second region during the annealing treatment. In FIG. 18, the region in which the Mn/Cr ratio is 1 or more is broader in the pinned magnetic layer 3 than in the antiferromagnetic layer 2. This may mean that diffusion of Cr from the PtCr layer 2A into the pinned magnetic layer 3 occurs during the annealing treatment.

Figure 19:
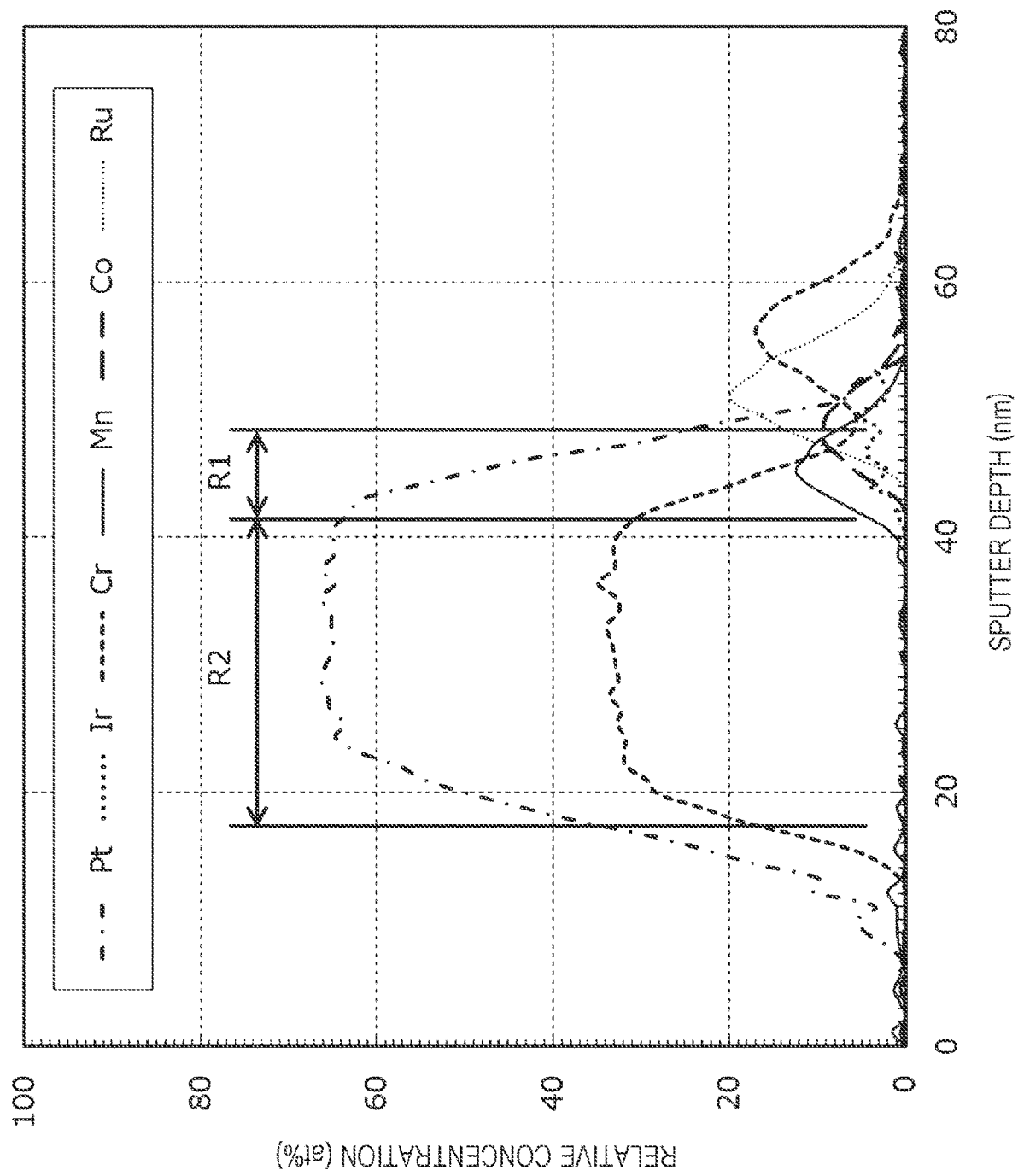
FIG. 19 shows depth profiles in a layered body in Example 3-9.
Figure 20:
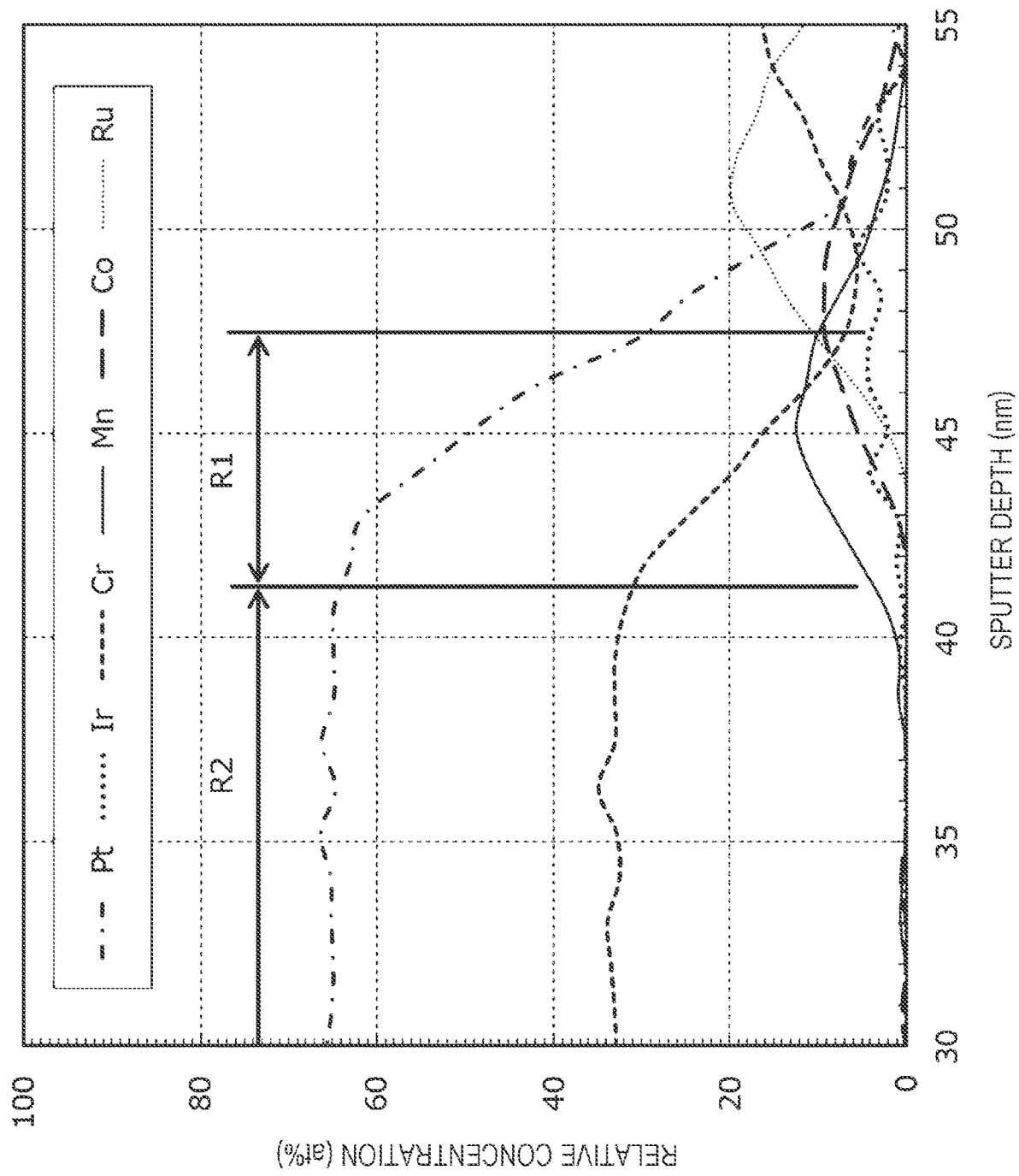
FIG. 20 shows profiles obtained by enlarging part of the depth profile in FIG. 19.
Figure 21:
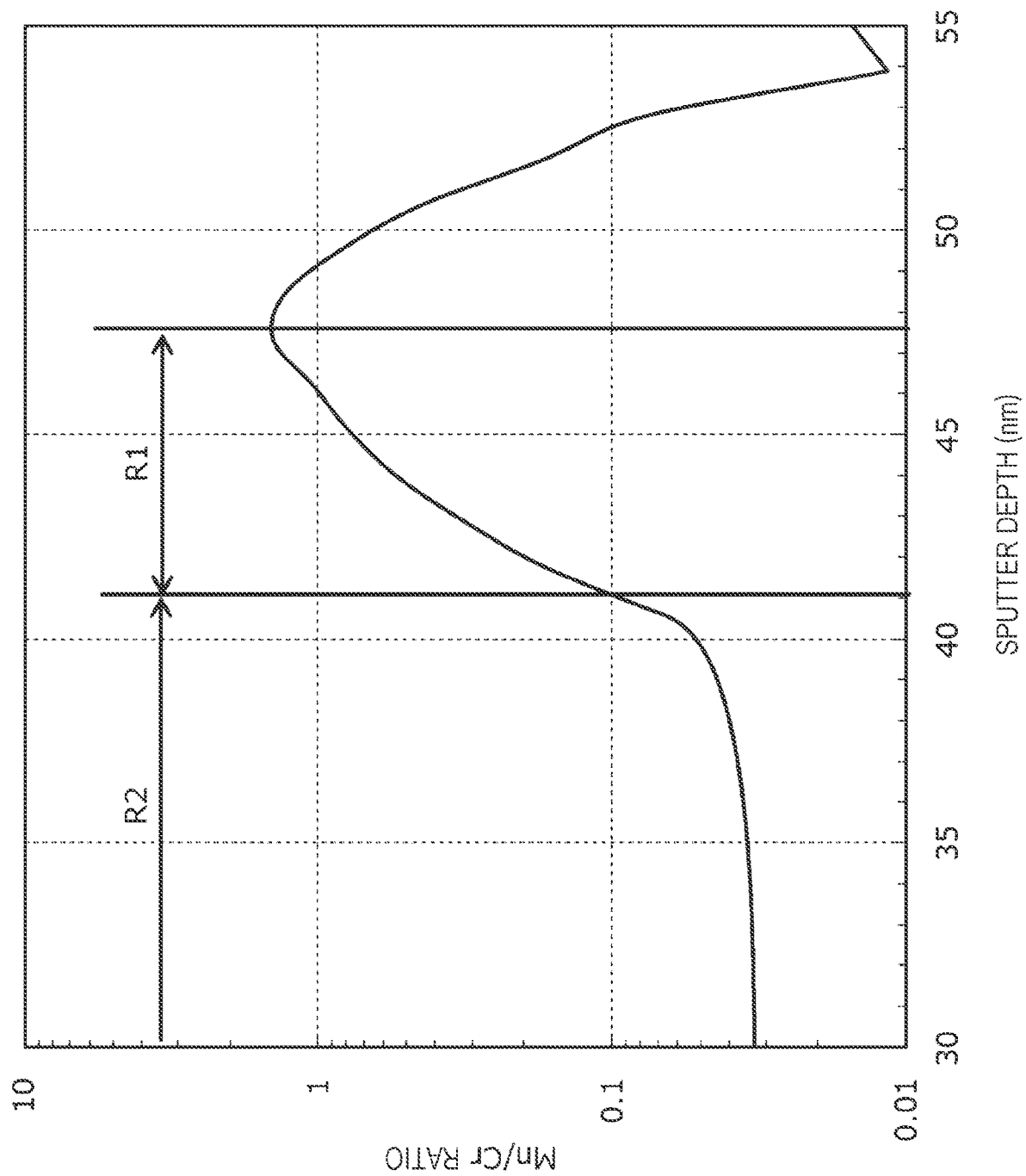
FIG. 21 is a graph showing the ratio of the content of Mn to the content of Cr (Mn/Cr ratio) with the range of the horizontal axis set to be equal to that in FIG. 20.

The depth profiles were obtained also for the layered body 23 in Example 3-9. The results are shown in FIGS. 19 to 21. In the layered body 23 in Example 3-9, the boundary between the first region R1 and the second region R2 in the antiferromagnetic layer 2 is located at a depth of about 41 nm, and the boundary between the antiferromagnetic layer 2 and the pinned magnetic layer 3 is located at a depth of about 47.5 nm. Therefore, the thickness of the first region R1 in the antiferromagnetic layer 2 is about 6.5 nm (47.5 nm-41 nm). The layered body 23 in Example 3-9 differs from the layered body 22 in Example 1-16 in that the PtMn layer 2D having a thickness of 8 Å is stacked at a position close to the pinned magnetic layer 3. In consideration of this, the results of the thickness computations are reasonable. In the layered body 23 in Example 3-9, the region in which the Mn/Cr ratio was 1 or more was more clearly observed in the first region R1.

What is claimed is:

1. An exchange coupling film comprising:
   an antiferromagnetic layer; and
   a ferromagnetic layer, the antiferromagnetic layer and the ferromagnetic layer being stacked together,
   wherein the antiferromagnetic layer has a structure including a PtCr layer, a PtMn layer, and an IrMn layer that are stacked in this order such that the IrMn layer is disposed closest to the ferromagnetic layer.

2. The exchange coupling film according to claim 1, wherein the IrMn layer is stacked in contact with the ferromagnetic layer.

3. The exchange coupling film according to claim 1, wherein the PtMn layer has a thickness of 12 Å or more.

4. The exchange coupling film according to claim 1, wherein the IrMn layer has a thickness of 6 Å or more.

5. The exchange coupling film according to claim 1, wherein the sum of the thickness of the PtMn layer and the thickness of the IrMn layer is 20 Å or more.

6. The exchange coupling film according to claim 1, wherein the thickness of the PtCr is larger than the sum of the thickness of the PtMn layer and the thickness of the IrMn layer.

7. The exchange coupling film according to claim 6, wherein the ratio of the thickness of the PtCr layer to the sum of the thickness of the PtMn layer and the thickness of the IrMn layer is 5:1 to 100:1.

8. The exchange coupling film according to claim 1, wherein the ferromagnetic layer has a thickness of from 12 Å to 30 Å inclusive.

9. The exchange coupling film according to claim 1, wherein the structure of the antiferromagnetic layer further includes a PtMn layer stacked between the IrMn layer and the ferromagnetic layer.

10. An exchange coupling film comprising:
an antiferromagnetic layer; and
a ferromagnetic layer, the antiferromagnetic layer and the ferromagnetic layer being stacked together,
wherein the antiferromagnetic layer includes an X(Cr—Mn) layer containing Mn, Cr, and one or more elements X selected from the group consisting of Ni and platinum-group elements,
wherein the X(Cr—Mn) layer includes a first region closer to the ferromagnetic layer and a second region farther from the ferromagnetic layer, and
wherein the content of Mn in the first region is higher than the content of Mn in the second region.

11. The exchange coupling film according to claim 10, wherein the first region is in contact with the ferromagnetic layer.

12. The exchange coupling film according to claim 10, wherein the first region has a portion in which the Mn/Cr ratio of the content of Mn to the content of Cr is 0.3 or more.

13. The exchange coupling film according to claim 12, wherein the first region has a portion in which the Mn/Cr ratio is 1 or more.

14. A magnetoresistance effect element comprising:
an exchange coupling film comprising:
  an antiferromagnetic layer; and
  a ferromagnetic layer, the antiferromagnetic layer and the ferromagnetic layer being stacked together,
  wherein the antiferromagnetic layer has a structure including a PtCr layer, a PtMn layer, and an IrMn layer that are stacked in this order such that the IrMn layer is disposed closest to the ferromagnetic layer; and
a free magnetic layer, the free magnetic layer and the exchange coupling film being stacked together,
wherein the ferromagnetic layer of the exchange coupling film forms at least part of a pinned magnetic layer.

15. A magnetic detector comprising:
the magnetoresistance effect element, wherein the magnetoresistance effect element comprises:
a magnetoresistance effect element comprising:
  an exchange coupling film comprising:
    an antiferromagnetic layer; and
    a ferromagnetic layer, the antiferromagnetic layer and the ferromagnetic layer being stacked together,
    wherein the antiferromagnetic layer has a structure including a PtCr layer, a PtMn layer, and an IrMn layer that are stacked in this order such that the IrMn layer is disposed closest to the ferromagnetic layer; and
  a free magnetic layer, the free magnetic layer and the exchange coupling film being stacked together,
wherein the ferromagnetic layer of the exchange coupling film forms at least part of a pinned magnetic layer.

16. The magnetic detector according to claim 15, further comprising:
a substrate; and
a plurality of the magnetoresistance effect elements, the plurality of magnetoresistance effect elements being disposed on the substrate,
wherein the plurality of magnetoresistance effect elements comprise a magnetoresistance effect element including a pinned magnetic layer having a pinned magnetization direction different from the pinned magnetization direction in the rest of the plurality of magnetoresistance effect elements.

* * * * *